(12) United States Patent
Ling

(10) Patent No.: US 8,247,248 B2
(45) Date of Patent: Aug. 21, 2012

(54) METHODS AND APPARATUS FOR FORMING UNIFORM LAYERS OF PHOSPHOR MATERIAL ON AN LED ENCAPSULATION STRUCTURE

(75) Inventor: Peiching Ling, San Jose, CA (US)

(73) Assignee: Achrolux Inc., Santa Clara, CA (US)

( * ) Notice: Subject to any disclaimer, the term of this patent is extended or adjusted under 35 U.S.C. 154(b) by 258 days.

(21) Appl. No.: 12/587,281

(22) Filed: Oct. 5, 2009

(65) Prior Publication Data

US 2011/0039358 A1    Feb. 17, 2011

Related U.S. Application Data

(60) Provisional application No. 61/216,374, filed on May 15, 2009, provisional application No. 61/273,129, filed on Jul. 30, 2009.

(51) Int. Cl.
  *H01L 21/00* (2006.01)
  *H01L 33/00* (2010.01)
(52) U.S. Cl. ............ 438/27; 438/29; 438/31; 438/69; 438/72; 438/98; 257/98; 257/99; 257/E33.001; 257/E33.061; 257/E33.067
(58) Field of Classification Search .......... 438/24, 438/26, 27, 29, 31; 257/98–100
  See application file for complete search history.

(56) References Cited

U.S. PATENT DOCUMENTS

| 3,672,927 A | 6/1972 | Spiller et al. |
| 5,019,748 A * | 5/1991 | Appelberg ............ 315/169.3 |
| 5,068,708 A | 11/1991 | Newman |
| 5,851,255 A | 12/1998 | Ohtsuki et al. |
| 6,114,704 A * | 9/2000 | Buck ........................ 250/372 |
| 6,123,890 A * | 9/2000 | Mazurek et al. ........... 264/293 |
| 6,204,523 B1 | 3/2001 | Carey et al. |
| 6,472,765 B1 | 10/2002 | Sano et al. |
| 6,812,500 B2 | 11/2004 | Reeh et al. |
| 6,833,669 B2 * | 12/2004 | George et al. ............. 313/506 |
| 7,479,662 B2 | 1/2009 | Soules et al. |
| 7,923,918 B2 | 4/2011 | Tamaki et al. |
| 2002/0187571 A1 | 12/2002 | Collins, III et al. |

(Continued)

FOREIGN PATENT DOCUMENTS

WO    2010/132160    11/2010

(Continued)

OTHER PUBLICATIONS

International Preliminary Report on Patentability, from a corresponding foreign application, mailed Nov. 2011, PCT/US10/33319.

*Primary Examiner* — Michael Lebentritt
*Assistant Examiner* — Karen Kusumakar
(74) *Attorney, Agent, or Firm* — Fountainhead Law Group P.C.

(57) ABSTRACT

A method for forming a layer of phosphor material on an LED encapsulant structure includes forming a layer of a phosphor material on a first surface, disposing the first surface to cause the phosphor material to be in contact with a surface of the LED encapsulant structure, applying a pressure between the first surface and the surface of the LED encapsulant structure, and causing the layer of the phosphor material to be attached to the LED encapsulant structure.

23 Claims, 21 Drawing Sheets

U.S. PATENT DOCUMENTS

| | | |
|---|---|---|
| 2003/0203104 A1 | 10/2003 | Crommentuyn et al. |
| 2004/0145913 A1* | 7/2004 | Ouderkirk et al. ............ 362/555 |
| 2005/0106329 A1 | 5/2005 | Lewis et al. |
| 2005/0224830 A1 | 10/2005 | Blonder et al. |
| 2006/0102914 A1* | 5/2006 | Smits et al. ..................... 257/98 |
| 2006/0171152 A1* | 8/2006 | Suehiro et al. ................ 362/363 |
| 2006/0260943 A1 | 11/2006 | Khaselev et al. |
| 2007/0004065 A1* | 1/2007 | Schardt et al. .................. 438/26 |
| 2007/0096131 A1* | 5/2007 | Chandra ......................... 257/99 |
| 2008/0048200 A1 | 2/2008 | Mueller et al. |
| 2008/0079017 A1 | 4/2008 | Loh et al. |
| 2008/0080165 A1* | 4/2008 | Kim et al. ....................... 362/84 |
| 2008/0157103 A1 | 7/2008 | Chandra |
| 2009/0001372 A1 | 1/2009 | Arik et al. |
| 2009/0085049 A1* | 4/2009 | Kolodin et al. .................. 257/98 |
| 2009/0179207 A1 | 7/2009 | Chitnis et al. |
| 2009/0179213 A1* | 7/2009 | Cannon et al. .................. 257/98 |
| 2009/0189179 A1* | 7/2009 | Wen et al. ..................... 257/100 |
| 2009/0212257 A1* | 8/2009 | Sohn et al. ............... 252/301.36 |
| 2010/0065864 A1 | 3/2010 | Kessels et al. |
| 2010/0119839 A1 | 5/2010 | Chen |
| 2010/0189429 A1* | 7/2010 | Butterworth .................. 396/155 |
| 2011/0031516 A1 | 2/2011 | Basin et al. |

FOREIGN PATENT DOCUMENTS

| | | |
|---|---|---|
| WO | 2010/132219 | 11/2010 |
| WO | 2010/132220 | 11/2010 |

* cited by examiner

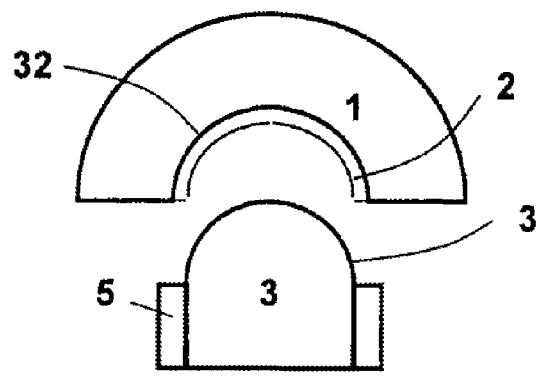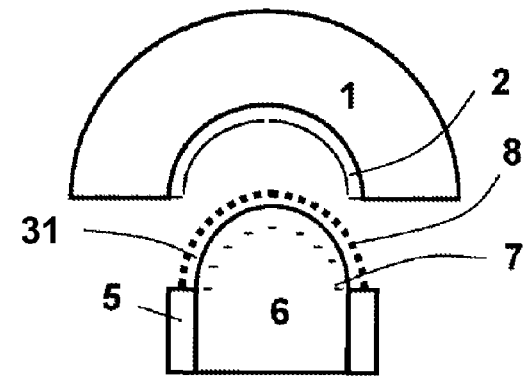
Fig. 1A　　　　　　　　Fig. 1B
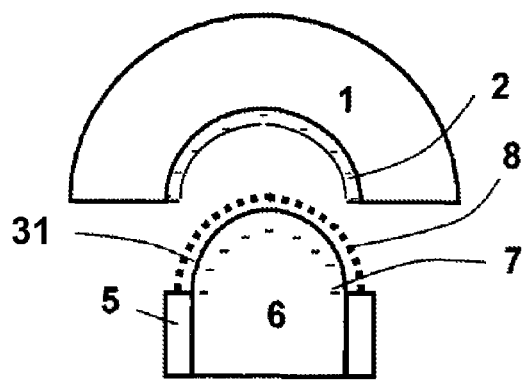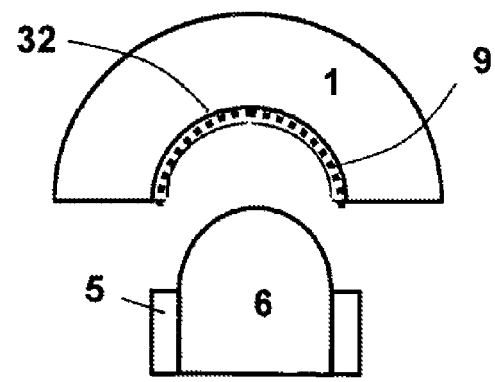
Fig. 1C　　　　　　　　Fig. 1D

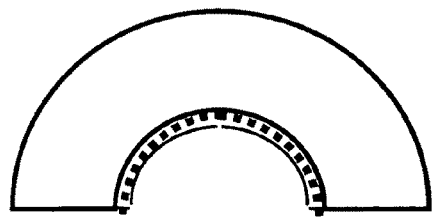
Fig. 8A
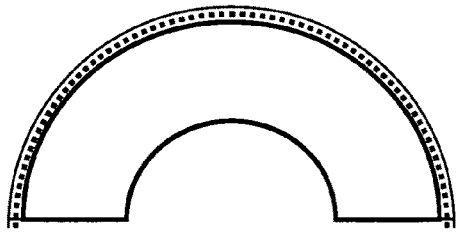
Fig. 8D
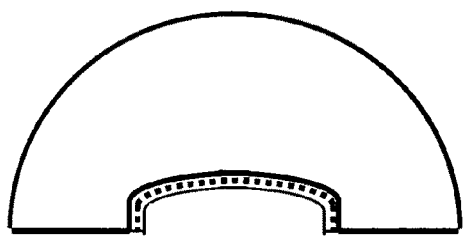
Fig. 8B
Fig. 8E
Fig. 8C
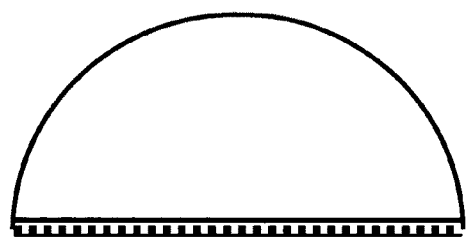
Fig. 8F
Fig. 8G

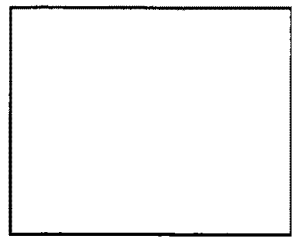
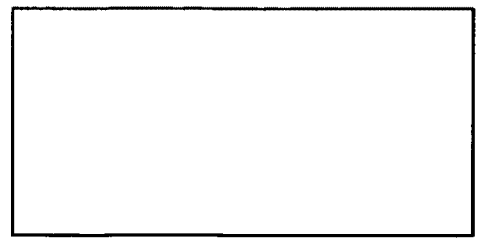
Fig. 15A        Fig. 15B
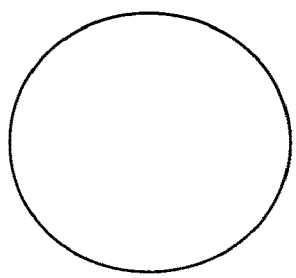
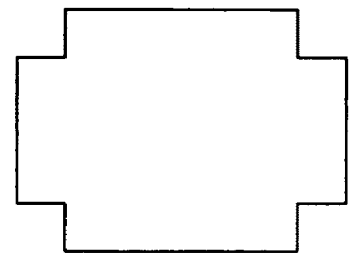
Fig. 15C        Fig. 15D
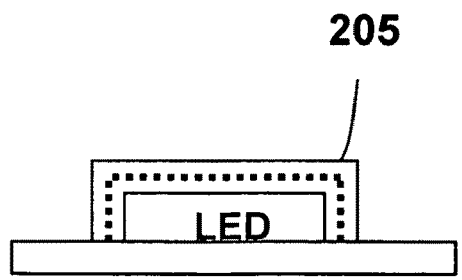
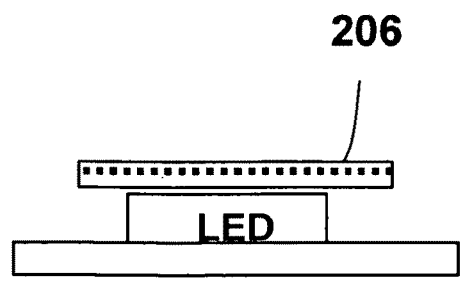
Fig. 15E        Fig. 15F

METHODS AND APPARATUS FOR FORMING UNIFORM LAYERS OF PHOSPHOR MATERIAL ON AN LED ENCAPSULATION STRUCTURE

CROSS-REFERENCES TO RELATED APPLICATIONS

This application claims priority to U.S. Provisional Application No. 61/216,374, filed May 15, 2009, by Peiching Ling and U.S. Provisional Application No. 61/273,129, filed Jul. 30, 2009, by Peiching Ling, both commonly owned and incorporated by reference in their entirety herein for all purposes. This application is also related to concurrently filed U.S. application Ser. No. 12/587,290 by Peiching Ling and U.S. application Ser. No. 12/587,291 by Peiching Ling, both of which are commonly owned and incorporated herein by reference in their entirety for all purposes.

BACKGROUND OF THE INVENTION

The present invention relates generally to material processing and optical apparatus techniques. More particularly, embodiments of the invention provide methods and systems for forming a layer of material that can be used in an optical device, such as a phosphor layer for a lens in an LED device.

Phosphor materials have been widely used in LED package for producing white light, or various colors of light (e.g. phosphor-converted green or red) with blue pump LEDs. There are several methods of depositing a phosphor material over a blue LED chip or package assembly today. As used herein, "phosphor" refers to any luminescent materials, which absorb light of one wavelength and emit light of a different wavelength. As known, there have several advantages to form phosphor component separately on encapsulation such as lens or cover before deposit or attach over LED chips. For example, increasing optical stability for long lifetime of devices as described in U.S. Pat. No. 6,204,523, or improving efficiency of devices by positioning the phosphor layer away from the LED as described in U.S. Pat. Nos. 6,812,500 and 7,479,662.

In addition, the separate phosphor component can be pre-optimized for optical performance such as light uniformity, as well as pre-characterized and binned to match LEDs of specific wavelength for improving consistency of color temperature, color quality, and even color yields in manufacturing.

Slurry methods or electrophoretic deposition (EPD) are some of the common methods of forming phosphor particle layer on LED chip or lens surface in manufacturing today. Chromaticity of phosphor converted LED is highly dependent on the properties of the phosphor particle layer, such as packing density, thickness, and uniformity on surface.

In slurry methods, phosphor particles are dispersed into silicone, epoxy or solvent filler material to form a phosphor mixture, applying said phosphor mixture to LED surface or package lens material by various techniques such as spray coating, or dipping coating, or dispensing or phosphor-in-cup or over molding on a support structure and so on. For slurry methods, common or known difficulties in applying phosphor layer to LED chip or package are many, such as Variation of thickness uniformity on surface. The slurry method usually forms a particle layer with varying thickness, especially applied on non-flat surface.

Difficulties in achieving high packing density of thin particles layers. Therefore, the coated layer contains a high percentage of binder materials, which is typically not a good thermal conductor, increasing the difficulty in dissipating heats for the package.

In electrophoretic deposition (EPD), although a high packing density of phosphor particles can be formed with a thickness less than 20 um, the known difficulties in EPD technique are Weak adhesion strength of phosphor particles increases handing difficulty during intermediate steps of fabrication.

Difficult to achieve highly uniform layer across larger area of surface.

Process requires a conductive surface. Extra chemical steps will be required if applied for non-conductive surface, and therefore increases process complexity.

In practice, therefore, using existing techniques of LED phosphor deposition described previously for pre-coating encapsulation material, which is usually an insulator, and has a non-flat surface, such as lens, with a high packing density of uniform phosphor particle layer is very challenge for applications in phosphor-converted LED today.

Accordingly, there is a need for improved coating techniques.

BRIEF SUMMARY OF THE INVENTION

Embodiments of the invention provide methods and systems for forming a layer of material that can be used in an optical device, such as a phosphor layer for a lens in an LED device.

Methods of forming uniform and controllable particle layer of luminescent materials on the surface of encapsulation structure are described herein for optoelectronic applications such as light emitting diodes. In some embodiments of the methods, the deposition process does not require keeping particle powders and binders in liquid suspension form. Instead, particle powders and binder materials are separately applied to the surface. In some embodiments, this process can accurately control packing density and layer thickness of phosphor particles. In an embodiment, the coating process is repeatable on the same surface to create a single or multiple uniform particle containing layers of luminescent materials on a hemispherical surface, concave or convex surface of different shapes, or flat surfaces. As a result, particle layers with a high packing density are formed and uniformly distributed on the surface. In particular embodiments, the uniform particle layer can be formed together with encapsulation material to simplify process steps.

According to a specific embodiment of the present invention, a method for forming a layer of an LED phosphor material includes disposing a first surface in a proximity of a powder including an LED phosphor material, forming a static electric field on the first surface, and forming a layer of the LED phosphor material on the first surface at least partially by using the static electric field.

According to another embodiment of the present invention, a method for forming a layer of a wavelength converting material includes disposing a first surface in a proximity of a powder that includes a wavelength converting material, forming a static electric field on the first surface, and forming a layer of the wavelength converting material on the first surface at least partially by using the static electric field.

According to an embodiment of the present invention, a method for forming a layer of an LED phosphor material includes disposing a first surface in a proximity of a powder that includes an LED phosphor material, forming electrostatic charges on the first surface, and forming a layer of the LED phosphor material on the first surface at least partially by using the electrostatic charges.

In an embodiment of the above method, disposing the first surface in a proximity of the powder includes disposing the first surface in an interior of a chamber and forming an airborne distribution of the powder in the interior of the chamber in a vicinity of the first surface.

In another embodiment, disposing the first surface in a proximity of the powder includes providing a reservoir of the powder and applying to said phosphor powder an electrostatic charge opposite to that of said electrostatic charge on the first surface.

In another embodiment, the above method also includes shaping a top portion of the powder to be substantially conformal to the first surface and positioning the first surface in a proximity of the top portion of the powder.

An alternative embodiment of the invention provides a method for forming a layer of a wavelength converting material. The method includes disposing a first surface in a proximity of a powder that includes a wavelength converting material, forming electrostatic charges on the first surface, and forming a layer of the wavelength converting material on the first surface at least partially by using the electrostatic charges.

Another alternative embodiment of the invention provides a method for forming a layer of a wavelength converting material. The method includes disposing a first surface in a proximity of a powder that includes a wavelength converting material, forming electrostatic charges on a surface layer of the powder, and forming a layer of the wavelength converting material on the first surface at least partially by using the electrostatic charges.

Another alternative embodiment of the present invention provides a method for forming a layer of phosphor material on an LED encapsulant structure. The method includes forming a layer of a phosphor material on a first surface, disposing the first surface to cause the phosphor material to be in contact with a surface of the LED encapsulant structure, applying a pressure between the first surface and the surface of the LED encapsulant structure, and causing the layer of the phosphor material to be attached to the LED encapsulant structure.

Another alternative embodiment of the present invention provides a method for forming a layer of a wavelength converting material on a surface. The method includes forming a layer of a wavelength converting material on a first surface, disposing a second surface in contact with the wavelength converting material on the first surface, applying a pressure between the first surface and the second surface, and causing the layer of the wavelength converting to be attached to the second surface.

Yet another alternative embodiment of the present invention provides a method for forming wavelength-conversion LED encapsulant structure. The method includes forming an LED encapsulant structure body, forming a layer of a wavelength-conversion material on a first surface, disposing the first surface to cause the wavelength-conversion material to be in contact with a surface region of the LED encapsulant structure body, applying a pressure between the first surface and the surface region of the LED encapsulant structure body, and causing at least a portion of the wavelength-conversion material to be at least partially embedded in the surface region of the LED encapsulant structure body.

Another alternative embodiment of the present invention provides a method for forming a LED encapsulant structure. The method includes forming a LED encapsulant structure body having a surface layer that includes a B-stage polymer, curing the LED encapsulant structure body using a first heating process, forming a layer of an LED phosphor material on the surface layer of the LED encapsulant structure body, softening the surface layer of the LED encapsulant structure body using a second heating process, and causing at least a portion of the LED phosphor material to be at least partially embedded in the surface layer of the LED encapsulant structure body.

Yet another alternative embodiment of the present invention provides a method for forming a LED encapsulant structure. The method includes forming a LED encapsulant structure body having a surface layer, forming a layer of a wavelength converting material on the surface layer of the LED encapsulant structure body, softening the surface layer of the LED encapsulant structure body using a heating process, and causing at least a portion of the wavelength converting material to be at least partially embedded in the surface layer of the LED encapsulant structure body.

A further understanding of the nature and advantages of the present invention may be realized by reference to the following drawings and the accompanying text in the remaining portions of the specification.

BRIEF DESCRIPTION OF THE DRAWINGS

FIGS. 1A, 1B, 1C, and 1D are simplified cross-sectional views of phosphor-coated lens during intermediate fabrication steps according to one embodiment of the present invention.

FIGS. 8A, 8B to 8G are simplified diagrams illustrating an alternative to form particle layers on a larger area of surface.

FIGS. 15A-15F are simplified diagrams illustrating examples of silicon sheets according to embodiments of the present invention.

DETAILED DESCRIPTION OF THE INVENTION

Figure 2A:
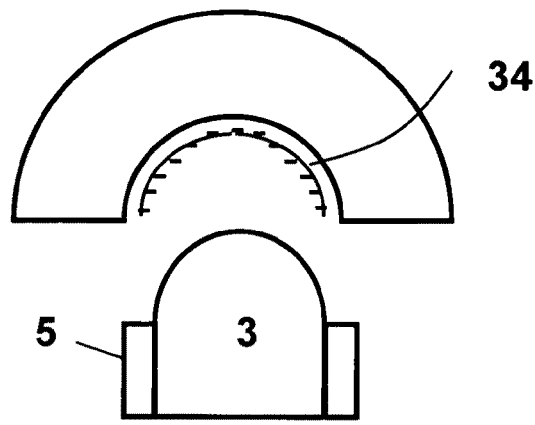
FIGS. 2A, 2B and 2C are simplified cross-sectional view of another embodiment of a method to form uniform phosphor coating on surface of the lens according to the present invention, wherein electrostatic charges are created on surface of binder material to attract phosphor particles on inner surface of lens.

In the specific examples described herein, phosphors are used for converting or altering light wavelength, e.g., for LED-based light sources. Common phosphors for these purposes include yttrium aluminum garnet (YAG) materials, terbium aluminum garnet (TAG) materials, ZnSeS+ materials, and silicon aluminum oxynitride (SiAlON) materials (such as α-SiAlON), etc. According to embodiments of the present invention, however, any material that converts or alters wavelength of incident light can be used as a phosphor material. As used herein, the term "phosphor" represents all materials that is capable of converting or altering a wavelength of light to another wavelength, including mixture or combination of different wavelength-converting or wavelength altering materials.

In some embodiments of the present invention, the coating process does not require keeping powder particles and binder in a liquid suspension form. Phosphor powder particles and binder materials can be coated separately, and then compressed together on object surface with a presser at an elevated temperature, e.g., 150 C to cure the binder. Phosphor powder particles are picked up and arranged by electrostatic charges created on the surface of piston presser or encapsulation material, and therefore a high packing density, and uniform thickness of phosphor particle layers can be achieved, as well as minimizing particle movement during deposition. In addition, because particles and binders are separately applied onto surface, packing density and layer thickness of phosphor particles can be controlled individually. The layer thickness of phosphor particles will be controlled during compression of phosphor particle and binder, where the lowest thickness is limited by particle size (e.g., ~5 μm to ~25 μm for typical LED phosphor), and thus the packing density of phosphor particles ($\rho^P$) can be calculated as $$\rho^P = V_P/V_T,$$

where $V_P$ is particle volume, which can be controlled by discharge voltage created on the surface of presser or objects. $V_B$ is binder volume after cure, which can be estimated before coating, and $V_T(=V_P+V_B)$ is desired volume of particle layer on surface. For example, $V_T=2\pi r^2 t$ is volume of particle layer on hemispherical surface, and t is desired thickness of phosphor layer on surface.

The electrostatic technology thus described permits reproducible precise formation of phosphor particles on surface for desired optical properties. Electrostatic charges are employed to attract phosphor particles for LED applications in the present invention for precisely controlling phosphor particles in mircogram (μg) quantities of phosphor powder with an uniform distribution on surface. Typically, for a 20 μm of YAG phosphor layer on a 2 mm lens surface (in diameter), the weight of phosphor particles is about 565 μg ($2\pi r^2 t \times$density) assuming the phosphor density ~4.5 g/cm$^3$.

In some embodiment, these steps can be repeatable on the same object surface, thus to form multiple layers of phosphor particles with controllable high packing density on objective surface. As used herein, "object surface" can be either conductive or non-conductive surface of different kinds of shapes, such as hemispherical surface, concave or convex surface, or flat surface.

Depending on the embodiment, for examples in LED application, phosphor particles can be coated on (a) LED encapsulation, or (b) any flexible surface for remote phosphor at system level application. The object surface may comprise various materials, including, but not limit to, silicone, epoxy or glass, thermoplastic resin or any other type of known encapsulating material, which has a sufficiently high index of refraction, and shaped to hemispherical or concave or convex or flat surface to increase light extraction from LED chip.

In an embodiment, a technique for forming uniform and controllable particle layers for examples, phosphor particles for LED application, on various shapes of surfaces is provided. By creating electrostatic charges on a presser or coating surface, particles can uniformly adhere to conductive or non-conductive surface. The particle layers are then compressed with a binder under a certain pressure at elevated temperature to form a high packing density and uniform thickness of particle layers. The process may be repeated to create multiple layers on the same surface. Each layer may have different properties such as containing different types of phosphor materials for a desired optical performance.

Methods of forming uniform particle layers in the embodiments are described using an example of forming uniform layer of phosphor particles on an inside surface of LED chip lens. The same method of forming uniform particle layers on surface for other applications can be understood by those skilled in the art with these examples.

Methods of forming uniform layer of phosphor particles on surface in various embodiments include one or more the following features:

I. Utilizing electrostatic charges generated on surface to attract phosphor powder particles. Because of the presence of an equal surface potential created on surface, uniform distribution of phosphor particles with high packing density can be attracted on surface, wherein phosphor powder particles may be non-charged or charged with electrostatic charges of polarity opposite to the charges created on the surface. Techniques in embodiments of the present invention to generate uniform distribution of phosphor particles on surface with electrostatic charges, can include one or more of the following:
a) Electrostatic charges may be generated on conductive surface or conductor surface coated with an insulator film to attract powder particles on the conductive surface, or
b) Electrostatic charges may be first generated on a conductive surface, and then transferred onto dielectric surface by contacting dielectric surface with the charged conductive surface, and therefore powder particles can be directly attracted on dielectric surface, or
c) Electrostatic charges may be generated on both conductive surface of a presser and dielectric surface of a receptor. Phosphor powder particles first adhere to charged conductive surface, and then discharge the conductive surface while conductive surface and receptor dielectric surface are close together to transfer powder particles to receptor dielectric surface.

II. After the uniform distribution of phosphor particle is attracted on surface, an inside or outside surface of receptor such as lens, is locally heated up by a presser or the entire receptor is heated up to a pre-determined temperature of melting or softening material at local surface region of the receptor, such as pre-coated binder or lens material itself at local surface region of the lens, and thereafter compressing phosphor particles and the melted or soften material at surface region of the lens for powder particle implantation.

Lens materials in the following embodiments may include any material that is substantially transparent to the wavelengths of interest. For examples, the lens material includes silicone, epoxy, glass, thermosetting plastics (thermosets), thermoplastics or any type of LED encapsulating material.

Binder materials in embodiments of the present invention can be in form of liquid, gel, resin, rubber or particles, including silicone, silanes, epoxy, glass, thermoplastics or any type of adhesive transparent to the wavelengths of interest. Binder materials such as silicone or epoxy may be partially cured or may be B-stage polymers, which can be pre-formed on object surface, and heated up to curing temperature under a certain pressure together with phosphor particles.

According to an embodiment of the present invention, a method for forming a layer of an LED phosphor material includes disposing a first surface in a proximity of a powder that includes an LED phosphor material, forming electrostatic charges on the first surface, and forming a layer of the LED phosphor material on the first surface at least partially by using the electrostatic charges.

In an embodiment of the above method, disposing the first surface in a proximity of the powder includes disposing the first surface in an interior of a chamber and forming an airborne distribution of the powder in the interior of the chamber in a vicinity of the first surface.

In another embodiment, disposing the first surface in a proximity of the powder includes providing a reservoir of the powder and applying to said phosphor powder an electrostatic charge opposite to that of said electrostatic charge on the first surface.

In another embodiment, the above method also includes shaping a top portion of the powder to be substantially conformal to the first surface and positioning the first surface in a proximity of the top portion of the powder.

In another embodiment, forming a electrostatic charge on the first surface includes forming a substantially uniform electric field normal to the first surface.

In another embodiment, forming a electrostatic charge on the first surface includes forming a substantially uniform substantially uniform distribution of electrostatic charges on the first surface.

In another embodiment, forming a electrostatic charge on the first surface includes forming an equipotential surface on the first surface.

In another embodiment, forming a electrostatic charge on the first surface includes forming a substantially uniform electric field normal to the first surface or a substantially uniform distribution of electrostatic charges on the first surface.

In another embodiment, disposing the first surface in a proximity of the powder includes maintaining a substantially equal distance between the first surface and a top surface of the powder in a reservoir.

In another embodiment, the first surface includes a shape corresponding to a shape of a phosphor layer optimized for optical performance for wavelength conversion.

In another embodiment, the first surface is planar.
In another embodiment, the first surface is non-planar.
In another embodiment, the first surface is spherical.
In another embodiment, the first surface is elliptical.
In another embodiment, the first surface includes an ellipsodic surface.

In another embodiment, the method also includes controlling the amount of powder on the first surface by varying the electrostatic charges on the first surface.

In another embodiment, the method also includes shaping the top portion of the powder using a second surface that is substantially conformal to the first surface.

In another embodiment, the first surface includes a surface of a lens or any LED encapsulation structure.

In another embodiment, the first surface includes a conductive surface, a conductive surface coated with an insulator layer, an insulator surface, or an insulator surface coated with a substantially conductive layer.

An alternative embodiment of the invention provides a method for forming a layer of a wavelength converting material. The method includes disposing a first surface in a proximity of a powder that includes a wavelength converting material, forming electrostatic charges on the first surface, and forming a layer of the wavelength converting material on the first surface at least partially by using the electrostatic charges.

In an embodiment of the above method, disposing the first surface in a proximity of the powder includes disposing the first surface in an interior of a chamber and forming an airborne distribution of the powder in the interior of the chamber in a vicinity of the first surface.

In another embodiment, disposing the first surface in a proximity of the powder includes providing a reservoir of the powder, applying to said phosphor powder an electrostatic charge opposite to that of said electrostatic charge on the first surface, shaping a top portion of the powder to be substantially conformal to the first surface, and positioning the first surface in a proximity of the top portion of the powder. In a specific embodiment, the method includes shaping the top portion of the powder using a second surface that is substantially conformal to the first surface.

In another embodiment, forming a static electric field on the first surface includes forming a substantially uniform electric field normal to the first surface or a substantially uniform distribution of electrostatic charges on the first surface.

In another embodiment, disposing the first surface in a proximity of the powder includes maintaining a substantially equal distance between the first surface and a top surface of the powder in a reservoir.

In another embodiment, the method also includes controlling the amount of powder on the first surface by varying the electrostatic charges on the first surface.

In another embodiment, the first surface includes a conductive surface, a conductive surface coated with an insulator layer, an insulator surface, or an insulator surface coated with a substantially conductive layer.

Another alternative embodiment of the invention provides a method for forming a layer of a wavelength converting material. The method includes disposing a first surface in a proximity of a powder that includes a wavelength converting material, forming electrostatic charges on a surface layer of the powder, and forming a layer of the wavelength converting material on the first surface at least partially by using the electrostatic charges.

In an embodiment of the above method, forming electrostatic charges on the surface layer of the powder includes forming a substantially uniform electric field normal to the surface layer of the powder or a substantially uniform distribution of electrostatic charges on the surface layer of the powder.

In another embodiment, disposing the first surface in a proximity of the powder includes maintaining a substantially equal distance between the first surface and a top surface of the powder in a reservoir.

In another embodiment, disposing the first surface in a proximity of the powder includes providing a reservoir of the powder, applying to said powder an electrostatic charge opposite to that of said electrostatic charge on the first surface, shaping a top portion of the powder to be substantially conformal to the first surface; and positioning the first surface in a proximity of the top portion of the powder. In a specific embodiment, the method includes shaping the top portion of the powder using a second surface that is substantially conformal to the first surface.

In another embodiment, disposing the first surface in a proximity of the powder includes, disposing the first surface in an interior of a chamber, and forming an airborne distribution of the powder in the interior of the chamber in a vicinity of the first surface.

In another embodiment, the method also includes controlling the amount of powder on the first surface by varying the electrostatic charges on the first surface.

In another embodiment, the first surface includes a conductive surface, a conductive surface coated with an insulator layer, an insulator surface, or an insulator surface coated with a substantially conductive layer.

Another alternative embodiment of the present invention provides a method for forming a layer of phosphor material on an LED encapsulant structure. The method includes forming a layer of a phosphor material on a first surface, disposing the first surface to cause the phosphor material to be in contact with a surface of the LED encapsulant structure, applying a pressure between the first surface and the surface of the LED encapsulant structure, and causing the layer of the phosphor material to be attached to the LED encapsulant structure.

An embodiment of the above method also includes coating the surface of the LED encapsulant structure with a binder material.

In another embodiment, the method also includes coating the surface of the LED encapsulant structure with a partially cured binder material or a B-stage polymer material.

In another embodiment, the method also includes softening a surface portion of the LED encapsulant structure with a heating process.

In another embodiment, the method also includes mixing fine particles of binder material with phosphor particles.

In another embodiment, the method also includes forming a layer of a binder material on the first surface before forming the layer of phosphor material.

In another embodiment, the above method also includes forming a layer of a binder material on the first surface after forming the layer of phosphor material.

In another embodiment, the LED encapsulant structure includes a lens.

In another embodiment, forming a layer of the LED phosphor material on the first surface includes forming electrostatic charges on the first surface, and attracting powder of the phosphor material to the first surface.

In another embodiment, the method also includes comprising removing the electrostatic charges to allow the powder to transfer to the surface of the LED encapsulant structure.

In another embodiment, forming the layer of the phosphor material on the first surface includes forming the layer of the phosphor material on a layer of a binder material overlying the first surface.

In another embodiment, removing the first surface from the LED encapsulant structure causes the layer of the phosphor material and the layer of the binder material to be attached to the LED encapsulant structure.

In another embodiment, the method also includes forming electrostatic charges on the surface of the LED encapsulant structure.

In another embodiment, the method also includes forming a second layer of phosphor material on the LED encapsulant structure. In a specific embodiment, the second layer of phosphor material has a different optical property from the first layer of phosphor material.

In another embodiment, the method also includes forming two or more layers of phosphor material on the LED encapsulant structure.

In another embodiment, each of the two or more layers of phosphor material has a different optical property from the first layer of phosphor material.

Another alternative embodiment of the present invention provides a method for forming a layer of a wavelength converting material on a surface. The method includes forming a layer of a wavelength converting material on a first surface, disposing a second surface in contact with the wavelength converting material on the first surface, applying a pressure between the first surface and the second surface, and causing the layer of the wavelength converting to be attached to the second surface.

In an embodiment of the above method, forming a layer of the wavelength converting material on the first surface includes forming electrostatic charges on the first surface, and attracting powder of the a wavelength converting material to the first surface.

In another embodiment, the method also includes coating the second surface with a binder material.

In another embodiment, the method also includes softening a surface portion of the LED encapsulant structure with a heating process.

In another embodiment, the wavelength conversion material includes fine particles of binder material.

In another embodiment, the method also includes forming electrostatic charges on the second surface.

In another embodiment, the method also includes forming a second layer of wavelength converting material on the second surface. In a specific embodiment, the second layer of wavelength converting material has a different optical property from the first layer of wavelength converting material.

In another embodiment, the method also includes forming two or more layers of wavelength converting material on the LED encapsulant structure.

In another embodiment, each of the two or more layers of wavelength converting material has a different optical property from the first layer of phosphor material In another embodiment, forming a layer of the wavelength converting material on the first surface includes exposing the first surface to a reservoir of powders of wavelength converting material, and causing a layer of a wavelength converting material to be formed on the first surface at least partially by electrostatic charges.

In another embodiment, forming a layer of the wavelength converting material on the first surface includes exposing the first surface to an airborne distribution of powders of a wavelength converting material, and causing a layer of a wavelength converting material to be formed on the first surface at least partially by electrostatic charges.

Yet another alternative embodiment of the present invention provides a method for forming wavelength-conversion LED encapsulant structure. The method includes forming an LED encapsulant structure body, forming a layer of a wavelength-conversion material on a first surface, disposing the first surface to cause the wavelength-conversion material to be in contact with a surface region of the LED encapsulant structure body, applying a pressure between the first surface and the surface region of the LED encapsulant structure body, and causing at least a portion of the wavelength-conversion material to be at least partially embedded in the surface region of the LED encapsulant structure body.

In an embodiment of the above method, the LED encapsulant structure body includes a lens.

In another embodiment, the wavelength-conversion material includes phosphor.

In another embodiment, the LED encapsulant structure body includes at least a surface layer that includes a B-stage polymer material.

In another embodiment, the LED encapsulant structure body includes at least a surface layer that includes a B-stage polymer material.

In another embodiment, the LED encapsulant structure body includes at least a surface layer of a thermal plastic material.

In another embodiment, the LED encapsulant structure body includes at least a surface layer of a glass.

In another embodiment, the method also includes coating a surface of the LED encapsulant structure body with a binder material.

In another embodiment, the method also includes coating the surface of the LED encapsulant structure with a partially cured binder material or a B-stage polymer material.

In another embodiment, the method also includes softening a surface portion of the LED encapsulant structure with a heating process.

In another embodiment, forming a layer of the wavelength-conversion material on the first surface includes forming electrostatic charges on the first surface, and attracting powder of the wavelength-conversion material to the first surface, disposing the first surface in a proximity of a powder that includes the wavelength-conversion material, and forming a layer of the wavelength-conversion material on the first surface at least partially by using the electrostatic field.

In another embodiment, the method also includes removing the electrostatic charges to allow the powder to transfer to the surface of the LED encapsulant structure.

In another embodiment, forming the layer of the wavelength-conversion material on the first surface includes forming the layer of the wavelength-conversion material on a layer of a binder material overlying the first surface.

In another embodiment, removing the first surface from the LED encapsulant structure causes the layer of the wavelength-conversion material and the layer of the binder material to be attached to the LED encapsulant structure.

In another embodiment, the method also includes forming a second layer of wavelength-conversion material on the LED encapsulant structure.

In another embodiment, the second layer of wavelength-conversion material has a different optical property from the first layer of wavelength-conversion material.

In another embodiment, the above method also includes repeated application of two or more layers of wavelength conversion material.

Another alternative embodiment of the present invention provides a method for forming a LED encapsulant structure. The method includes forming a LED encapsulant structure body having a surface layer that includes a B-stage polymer, curing the LED encapsulant structure body using a first heating process, forming a layer of an LED phosphor material on the surface layer of the LED encapsulant structure body, softening the surface layer of the LED encapsulant structure body using a second heating process, and causing at least a portion of the LED phosphor material to be at least partially embedded in the surface layer of the LED encapsulant structure body.

In another embodiment of the above method, forming the layer of the LED phosphor material on the surface layer of the LED encapsulant structure body includes forming a layer of the LED phosphor material on a first surface, disposing the LED phosphor material on the first surface to be in contact with the surface layer of the LED encapsulant structure body, and applying a pressure between the first surface and the surface layer of the LED encapsulant structure body.

In another embodiment, forming a layer of the LED phosphor material on the first surface includes disposing the first surface in a proximity of a powder including the LED phosphor material, forming electrostatic charges on the first surface, applying to said phosphor powder an electrostatic charge opposite to that of said electrostatic charge on the first surface, and forming a layer of the LED phosphor material on the first surface at least partially by using the electrostatic charges.

In another embodiment, forming a layer of the LED phosphor material on the first surface includes disposing the first surface in an interior of a chamber, forming an airborne distribution of particles of the LED phosphor material in the interior of the chamber in a vicinity of the first surface, forming electrostatic charges on the first surface, and forming a layer of the LED phosphor material on the first surface at least partially by using the static electric charges.

In another embodiment, forming a layer of the LED phosphor material on the surface layer of the LED encapsulant structure body includes disposing the surface layer of the LED encapsulant structure body in a proximity of a powder including the LED phosphor material, forming electrostatic charges on the surface layer of the LED encapsulant structure body, and forming a layer of the LED phosphor material on the surface layer of the LED encapsulant structure body at least partially by using the static electric charges.

In another embodiment, forming a layer of the LED phosphor material on the surface layer of the LED encapsulant structure body includes disposing at least a surface portion of the LED encapsulant structure body in an interior of a chamber, forming an airborne distribution of particles of the LED phosphor material in the interior of the chamber in a vicinity of the surface layer of the LED encapsulant structure body, forming electrostatic charges on the surface layer of the LED encapsulant structure body, and forming a layer of the LED phosphor material on the surface layer of the LED encapsulant structure body.

Yet another alternative embodiment of the present invention provides a method for forming a LED encapsulant structure. The method includes forming a LED encapsulant structure body having a surface layer, forming a layer of a wavelength converting material on the surface layer of the LED encapsulant structure body, softening the surface layer of the LED encapsulant structure body using a heating process, and causing at least a portion of the wavelength converting material to be at least partially embedded in the surface layer of the LED encapsulant structure body.

In an embodiment of the above method, forming a layer of the wavelength converting material on the surface layer of the LED encapsulant structure body includes forming a layer of a wavelength converting material on a first surface, and transferring the wavelength converting material to the surface layer of the LED encapsulant structure body.

In another embodiment, forming a layer of the wavelength converting material on the surface layer of the LED encapsulant structure body includes exposing the surface layer of the LED encapsulant structure body to a reservoir of powders of wavelength converting material, and causing a layer of the wavelength converting material to be formed on the surface layer of the LED encapsulant structure body at least partially by static electric charges.

In another embodiment, forming a layer of the wavelength converting material on the surface layer of the LED encapsulant structure body includes exposing the surface layer of the LED encapsulant structure body to an airborne distribution of particles of the wavelength converting material, and causing a layer of the wavelength converting material to be formed on the surface layer of the LED encapsulant structure body.

More details of some of the embodiments are described in the examples below with reference to the drawings.

Preformed Lens With Coated Binder on Lens

FIGS. 1A, 1B, 1C, and 1D are simplified diagrams illustrating one embodiment of the present invention. Depending on the embodiment, phosphor particles are attracted on a presser surface, and electrostatic charges may be generated on surface of presser or both surfaces of presser and lens. As shown in FIG. 1, a hemispheric surface 32 of lens 1 is pre-coated with a thin layer of binder material 2. The lens 1 may be made from any material that is substantially transparent to the wavelengths of interest. For examples, the lens material includes silicone, epoxy, glass, thermosets, thermoplastics or any type of LED encapsulating material. The binder 2 is applied to the inside surface of the lens by pushing up a piston 3 to the surface 32, and can then be heated up to partially cure the binder or use B-stage epoxy as binder material. The piston surface 31 is shaped with a similar curvature as the hemispheric surface 32 of the lens 1 so that the binder can be applied uniformly to lens.

As shown in FIG. 1B, the second piston 6, which may be the same as piston 3 or slightly smaller than piston 3, is charged up with electrostatic charges 7. Because of the presence of uniform electrostatic charges over the surface 31, the phosphor powder particles 8 can adhere to the top surface 31 of the piston 6 with a uniform distribution. Amount of phosphor particles attracted onto the piston surface can be controlled by charges applied on the piston 6. The binder surface 2 may be not charged as shown in FIG. 1B or may be charged with electrostatic charged as shown in FIG. 1C.

The piston 6 is then pushed up to compress the binder 2, and heated up or the entire lens is heated up to fully cure the binder 2. A stopper 5 around the piston is to control compression distance and confine phosphor particles on surface. Optionally, the piston 6 is discharged to release phosphor particles 8 to the binder 2 on lens. The lens is then baked to cure the binder for example at about 150° C. After curing cycle is completed, a layer of phosphor powder particles 9 is formed, and bonded to an inside surface 32 of the lens 1 as illustrated in FIG. 1D. The same process can be repeated to form multiple layers of phosphor particle containing layers. Additional layer of binder material, which is optional as a protective coating, can be applied onto the particle layer to protect the formed particle layer from handling damage at subsequent process steps.

Preformed Lens With Coated Binder on Lens

Figure 2B:
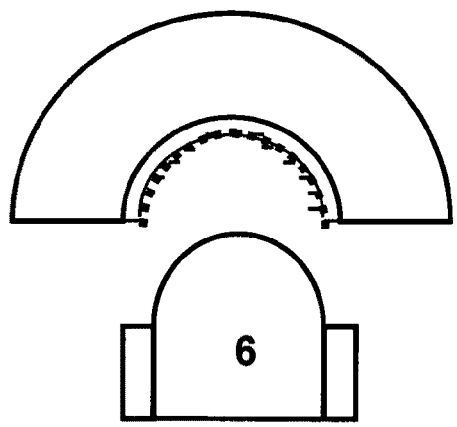
Figure 2C:
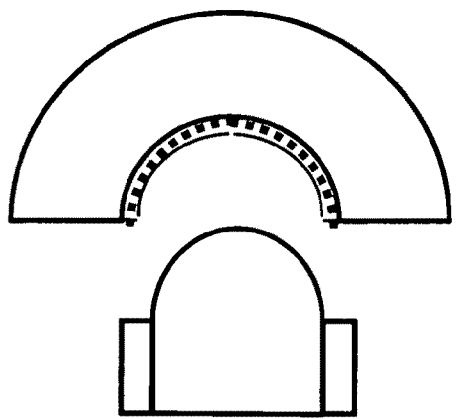

FIGS. 2A, 2B, and 2C are simplified diagrams illustrating another embodiment of the present invention. The electrostatic charges are applied on lens side said an inside surface of the lens, which is pre-coated with a layer of partially cured binder material or B-stage polymers. The electrostatic charges on an inside surface of lens are created by contacting with charged metal surface with the same curvature of inside surface of lens such as a piston 3. Phosphor particles then adhere to the inside surface of the lens. Piston 6 is heated up to, for example, 150° C., or the entire lens is heated up, and then piston 6 is pushed up to press phosphor particles onto the binder surface 34. The lens is then baked to cure the binder for example at about 150° C. The same process can be repeated to form multiple layers of phosphor particle containing layers. Additional layer of binder material, which is optional as a protective coating, can be applied onto the particle layer to protect the formed particle layer from handling damage at subsequent process steps.

Preformed Lens With Coated Binder on Presser Surface

FIGS. 3A, 3B, 3C, and 3D simplified diagrams illustrating another embodiment of the present invention. The binder material is deposited on the piston surface 31, and partially cured or deposited with B-stage polymers.

Figure 3A:
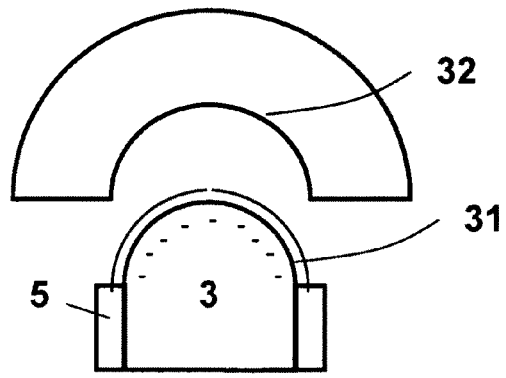
FIGS. 3A, 3B, 3C, and 3D are simplified cross-sectional views of yet another embodiment of a method to form uniform phosphor coating on surface of the lens according to the present invention, wherein particle layer and binder are formed on surface of presser together, and compressed onto inner surface of the lens. Electrostatic charges may be generated on surface of presser or both surfaces of presser and lens.
Figure 3B:
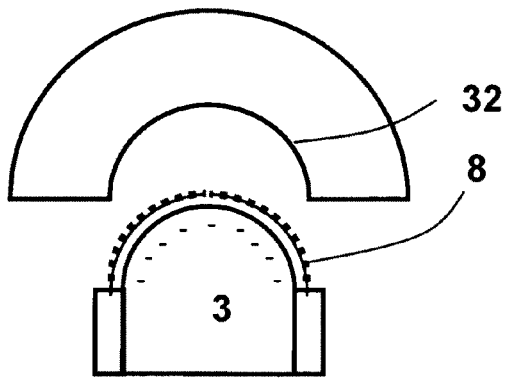
Figure 3C:
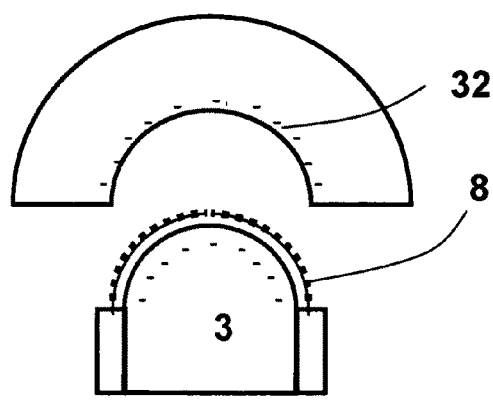
Figure 3D:
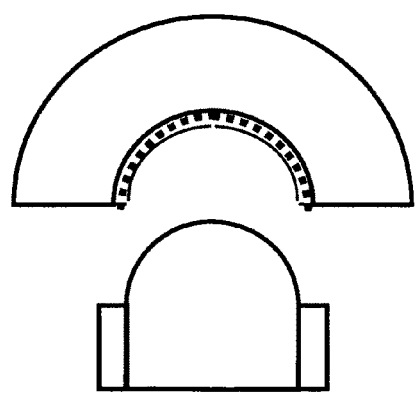

Electrostatic charges are then generated on the binder surface by contacting with a charged metal surface of the same curvature or charge up the entire piston as shown in FIG. 3A. Inner surface 32 of the lens may be not charged as in FIG. 3B or charged as in FIG. 3C. The phosphor particles uniformly adhere to the binder surface, and then the piston is raised to make contact with the lens. The piston can heat up, or the entire lens is heated up, compressing phosphor particles and binders onto an inside surface of the lens to fully cure the phosphor particle containing layer.

Optionally, the piston 3 is discharged when the piston is brought close to the surface of the lens to release phosphor particles 8 to the binder 3 on lens. The piston heats up, or the entire lens is then baked to cure the binder for example at about 150° C. The same process can be repeated to form multiple layers of phosphor particle containing layers. Additional layer of binder material, which is optional as a protective coating, can be applied onto the particle layer to protect the formed particle layer from handling damage at subsequent process steps.

Preformed Lens With Particle Binder Mixed With Phosphor Powders

Figure 4A:
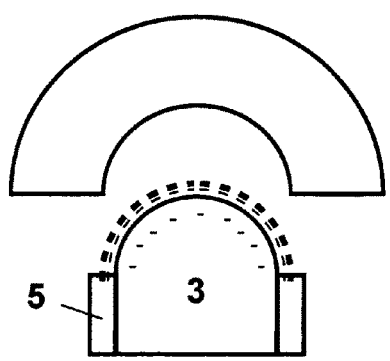
FIGS. 4A, 4B, 4C, and 4D are simplified cross-sectional views of another embodiment of a method to form uniform phosphor coating on surface of the lens according to the present invention, wherein binder material is in particle form, mixed with phosphor particles, and then adhere to charged surface of presser or lens.
Figure 4B:
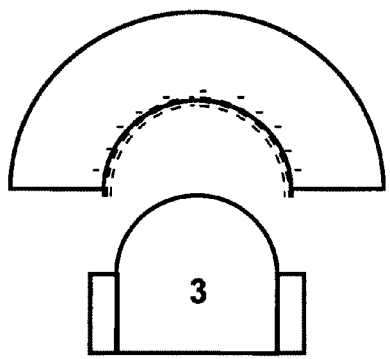
Figure 4C:
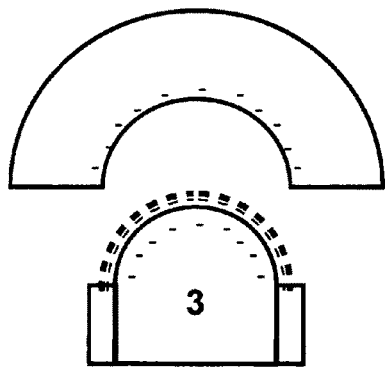
Figure 4D:
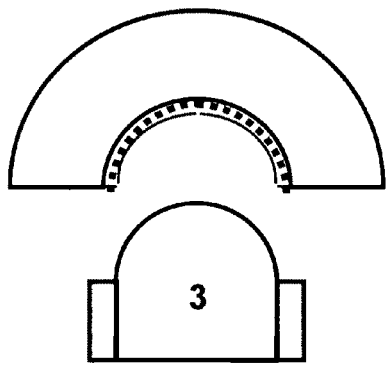

FIGS. 4A, 4B, 4C, and FIG. 4D are simplified diagrams illustrating another embodiment of the present invention. The binder material in this embodiment is in particle form, which is pre-mixed together with phosphor powder particles. The binder particles may be silicone, or epoxy fine particles of appropriately mixed A and B parts or fine particles of glass, thermoplastics, thermosets or B-stage polymers. Electrostatic charges can be created on either piston surface FIG. 4A or lens surface FIG. 4B or both surfaces as illustrated in FIG. 4C.

As shown in FIG. 4A or FIG. 4C, phosphor and binder particles then uniformly adhere to the surface of the piston. The piston or entire lens is heated up before or after the piston is pushed up to compress phosphor and binder particles onto an inside surface of the lens. Meanwhile, the piston is discharged to release phosphor particles to the surface of lens.

As shown in FIG. 4B, phosphor and binder particles may be uniformly attracted to the inner surface of lens. The phosphor and binder particles are compressed under a certain pressure at elevated temperature for example 150 C for silicone binder. The binder material is melted, creating bonding between phosphor particles, and secure phosphor particles to the lens surface. The lens is then baked to cure the binder for example at about 150° C. The same process can be repeated to form multiple layers of phosphor particle containing layers. Optionally, another additional layer of binder material can be applied onto the particle layer to protect the formed particle layer from handling damage at subsequent process steps.

Forming Lens and Phosphor Particle Layers Together

In a particular embodiment of the present invention, part of lens 1 material at surface region 32 can serve as binder material for particle layers during fabrication, and thus particle coating process can be simplified by eliminating steps of binder coating. During lens formation process, such as injection molding or compression molding or transfer molding process, silicone, epoxy or B-stage polymer or glass or thermosets, or thermoplastics may be selected for lens material.

Figure 5A:
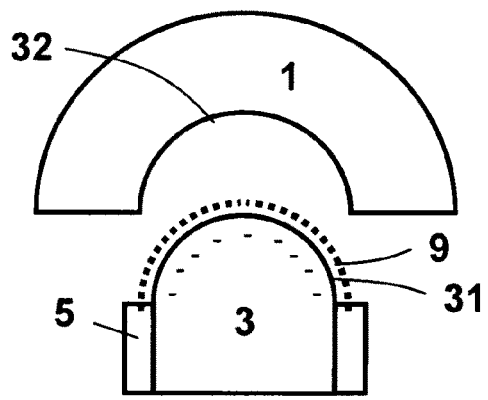
FIGS. 5A, 5B, 5C, and 5D are simplified cross-sectional view of another embodiment of a method to form uniform phosphor coating on surface of the lens according to the present invention, wherein lens material serves as a binder to form phosphor particle layer during lens formation.
Figure 5B:
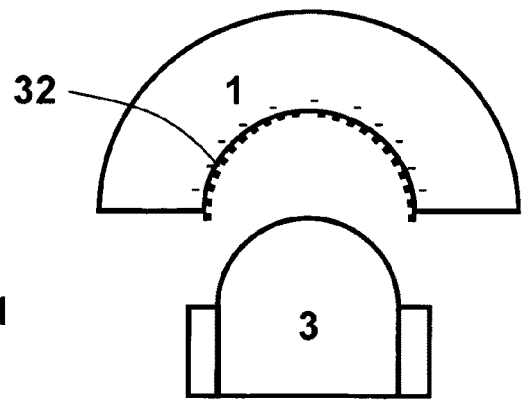
Figure 5C:
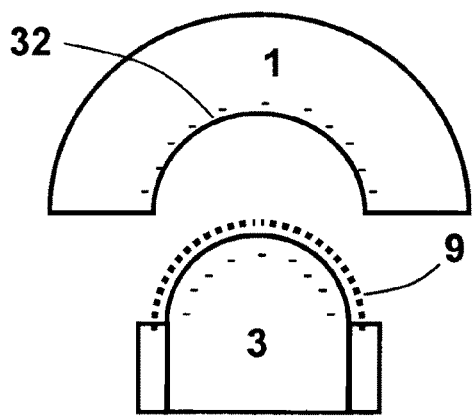
Figure 5D:
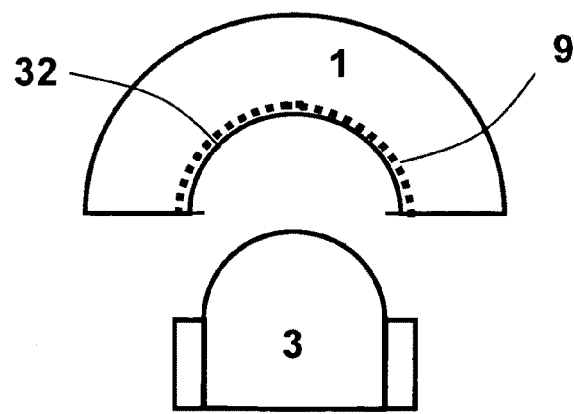

For material such as silicone, epoxy, B-stage polymer or thermosets, the lens is first shaped by heating up the lens material to about 100° C. to partially cure the material. Electrostatic charges may be created on either piston surface as shown in FIG. 5A or lens surface FIG. 5B to attract phosphor particles. Charges may be generated on both surfaces, as shown in FIG. 5C. Before or after the piston surface is brought close to the lens surface, the piston or entire lens is heated up to a pre-determined temperature, melting or softening material at local surface region 32 of the lens, and then phosphor particles 9 are compressed onto inner surface of the lens. During the process, the piston is optionally discharged while surface of piston and lens is close together to transfer powder particles to dielectric surface. The lens with implanted phosphor particles as shown in FIG. 5D is then baked to fully cure the lens material.

For lens material such as glass, or thermoplastics, the lens is pre-formed at a higher temperature. Phosphor powder particles first adhere to charged surface 31 of piston or lens surface 32 as shown in FIG. 5A or FIG. 5B. Before or after the piston surface is brought close to the lens surface, the piston or entire lens is heated up to a pre-determined temperature, melting or softening material at local surface region 32 of the lens, and the phosphor particles 9 on charged surfaces are compressed onto inner surface of the lens 32 under an appropriate pressure and temperature. At such temperatures, surface material surface of lens is softened or melted to bond particles within the surface of lens during formation process. During the process, the piston is optionally discharged while surface of piston and lens is close together to transfer powder particles to dielectric surface.

Depending on the material, the lens material may be silicone or B stage polymer or glass or thermosetting plastics (thermosets), thermoplastics in this embodiment. In this embodiment, because lens material at surface region serves as an adhesive of phosphor particles on lens, so that glue coating step described above can be eliminated to simplify the formation process. Furthermore, the refractive index of lens material may be selected to match the refractive index of phosphor powder material to enhance light extraction at the bonding interface of phosphor material and the lens in the LED package.

In another embodiment, phosphor particles can be applied to both the surface of the piston and the inside surface of the lens by application of electrostatic charges to the surface of the piston and the inside surface of the lens. Then the piston is pressed against the lens. The pressure applied from the piston against the lens implants the phosphor particles into the softened surface of the lens.

In some embodiments, the process described above can be repeated to form multiple layers of phosphor particle containing layers.

In another embodiment, an optional protective coating can be applied onto the particle layer afterwards to protect the formed particle layer from handling damage at subsequent process steps.

Forming Phosphor-Containing Layer on a Separate Carrier, and Attach the Carrier to the Lens The phosphor layer can be first formed on a separate supporting carrier, such as silicone, glass, thermoplastics or any type of LED encapsulating material, and thereafter attach the carrier containing phosphor layers to the lens. The formation of uniform layers of phosphor particles on a separate carrier can be achieved by using one of the methods described above.

In an embodiment, phosphor particle layers can be formed on one side or both sides of carrier surface with even different properties of phosphor materials as illustrated in FIGS. 6A, 6B, 6D, 6E, 6G or 6H. The carrier surface may be a piece of flat plate 61 or shaped with a similar curvature 62 as the receptor surface, such as lens surface, or in a shape of hemisphere 63. The coating process on the carrier can be repeated to form multiple layers of phosphor particle containing layer on the carrier surface. The supporting carrier may be attached to the receptor, such as lens, with an appropriate adhesive.

Figure 6A:
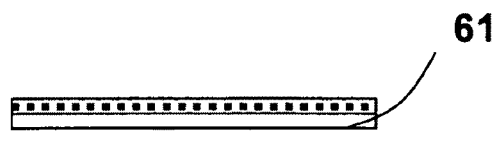
FIGS. 6A-6I are simplified cross-sectional views of forming phosphor-containing layers on a separate supporting carrier, and then attach the carrier to the lens structure according to another embodiment of the present invention.
Figure 6B:
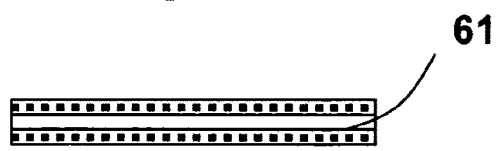
Figure 6C:
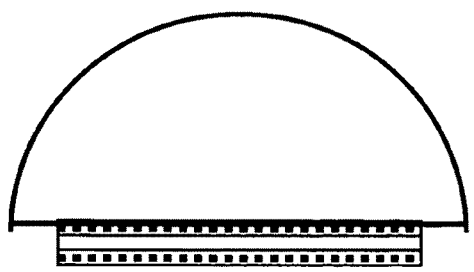
Figure 6D:
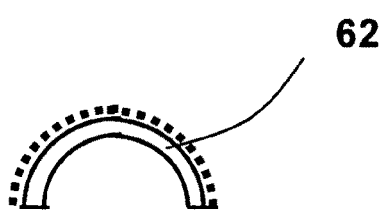
Figure 6E:
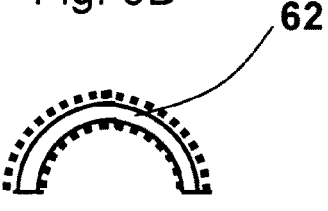
Figure 6F:
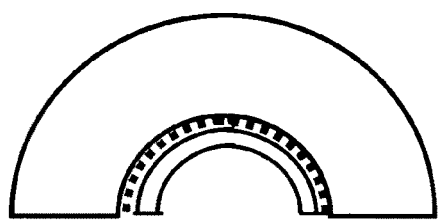
Figure 6G:
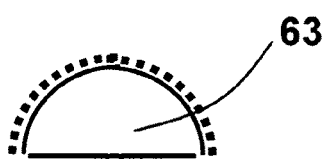
Figure 6H:
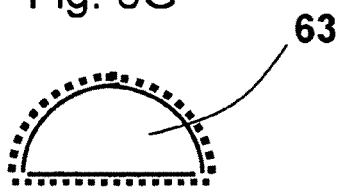
Figure 6I:
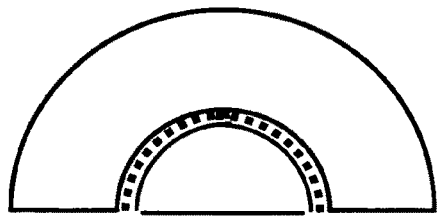

Alternatively, the phosphor-containing carrier may be attached to an lens without an additional adhesive as described above for some lens materials such as glass or thermoplastics, wherein lens material at surface region serves as an adhesive of phosphor particles on lens, so that glue coating step can be eliminated by heating up the phosphor containing carrier or entire the receptor to a certain temperature, melting or softening material at surface region of supporting carrier or lens itself to combine the phosphor containing carrier and the receptor such as lens together, as shown in FIGS. 6C, 6F, and 6I. The dimension of the supporting carrier may be varied with desired optical performance, depending on LED package design. The refractive index of supporting carrier or lens material may be selected to match the refractive index of the phosphor material, e.g., phosphor at ~1.8, to enhance light extraction at the bonding interface. In some instances the enhancement can be ~10%.

Application for Multiple Layers of Phosphor Particles on Surface

Figure 7:
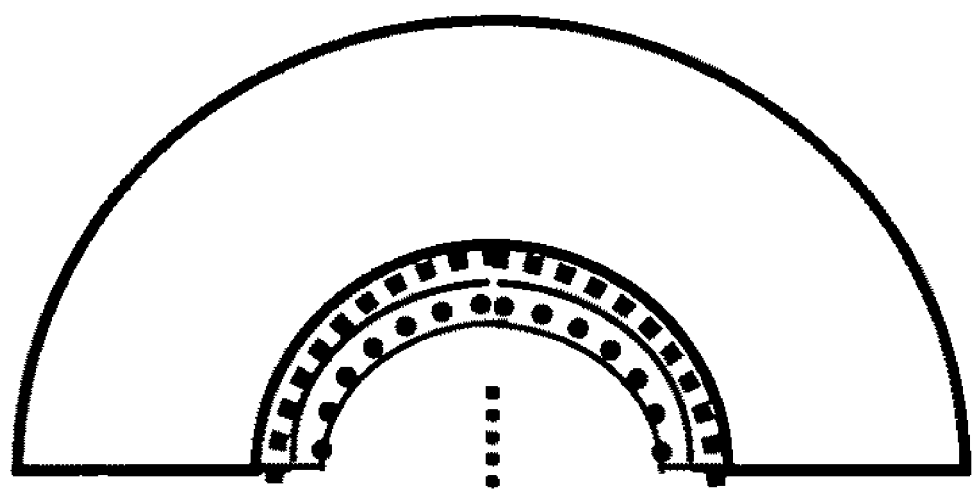
FIG. 7 is a simplified diagram illustrating a method for forming multiple uniform particle layers according to another embodiment of the present invention.

According to another embodiment of the present invention, the processes for forming a uniform particle layer described above can be simply repeated to form a stack of phosphor particle containing layers or for even different types of phosphor materials (e.g. red, green, yellow, amber, and so on) on the same object surface, as shown in FIG. 7. Multiple layers of particle materials are then uniformly formed, and separated from each other on the coated surface. Therefore, process technique for forming multiple layers of phosphor particles described in the present invention offers flexibility to alter layer sequence of different phosphor materials for varying light absorption passing through a stack of different phosphor materials in layer structure to tune optical properties such as color rendering index (CRI) or conversion efficiency, and so on for LED application.

Applications for Various Shapes and Dimensions of Encapsulation Surface

In another embodiment, the process techniques can be extended for applying phosphor particle layers to various shapes of surfaces with an appropriate counterpart presser, including Concave surface, e.g. inner surface of lens or cover, as illustrated in FIGS. 8A, 8B, and 8C;
Convex surface like outer surface of lens or cover, as illustrated in FIG. 8D, and 8E; and
Flat surface or a plate, as illustrate in FIG. 8F and FIG. 8G.

Depending on the embodiment, the processes in the present invention can be applied to various dimensions of encapsulation structure with an appropriate presser for encapsulating surface. The dimension may be varied with LED quantity inside the package in applications. In addition, surface curvature of inside or outside of the lens or cover need not be limited, and can be varied dependent on LED package. For example, the lens or cover as shown in FIG. 8A or 8D may be suitable for non-flip chip devices with a wire connecting to the top metal of devices. The lens as shown in FIGS. 8A and 8D is designed in the way of completely encapsulating the wire and devices. For flip-chip devices, since there is no wire connecting on the top of devices, particle layers on inner surface may be placed close to device surface as shown in FIGS. 8B, 8C, 8E, and 8F, which is primarily based on desired optical performances.

Coating Particle Layers on a Larger Area of Flat Surface

Figure 9A:
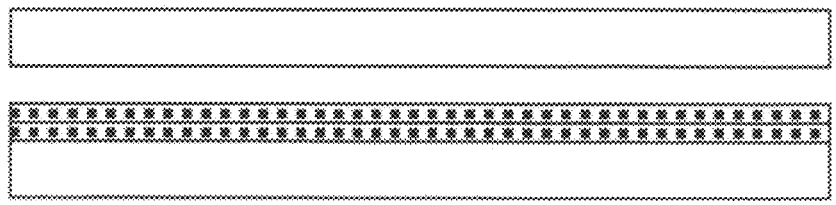
FIG. 9 is a simplified diagram illustrating the design of a piston presser for in-process monitor of amount of luminescent material on piston surface.
Figure 9B:
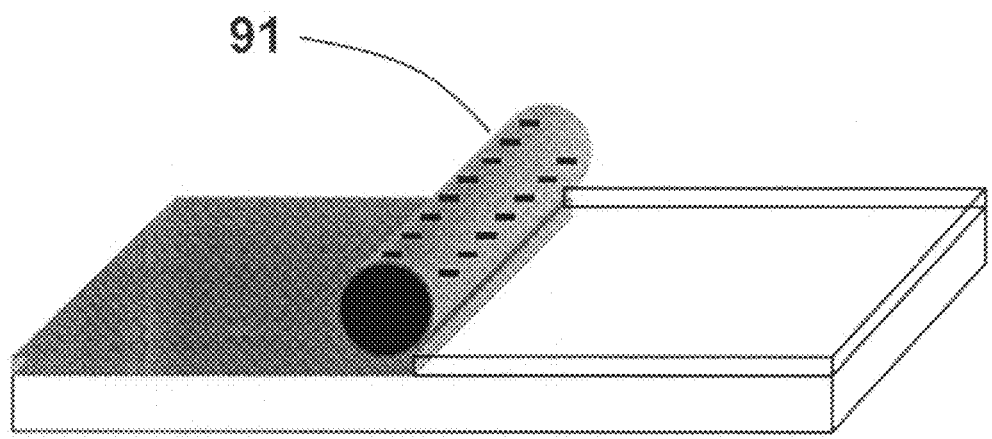

In some embodiments, techniques described herein can be used to form uniform particle layers on a larger area of flat surface, such as a flat panel, populated LED submount wafers, or flexible laminating sheets, and so on. In these embodiments, the presser may be in a flat shape FIG. 9A or a roller as shown in FIG. 9B to optimize throughputs. For a flat presser, the processes described above can be used to form uniform particle layers on the flat surface.

Alternatively, the presser can be in a roller form 91 for purposes of optimizing production throughput or facilitating creation of electrostatic charges on presser surface for a larger area of coating process. A thin layer of binder material is deposited on an object surface, such as a flat panel, populated LED submount wafers, or flexible laminating sheet, and so on. The binder material can be partially cured or B-stage polymers. Similar to the techniques described above, electrostatic charges can be created on the roller surface or the coating surface. In some embodiments, electrostatic charges can be created on both the roller surface and the coating surface. Depending on the embodiment, the charge distribution can be varied between the roller surface and the coating surface.

For a charged roller, the roller can pick up powder particles or mixture of particle powder from a powder feeder using the methods described above, and heated up to for example 150° C. to compress the powder onto the surface. The panel or submount or flexible laminating sheets is then baked to cure the binder for example at about 150° C. As mentioned before, an optional protective layer can be deposited to prevent particle layers from handling damage.

For the case of electrostatic charges created on the surface of binder material, powder particles will adhere directly onto binder surface, and then the roller presser heated up to for example 150° C. to roll over the entire surface with a certain pressure to secure the particle layer. The panel or submount or flexible laminating sheets is then baked to cure the binder for example at about 150° C. As mentioned before, an optional protective layer can be deposited to prevent particle layers from handling damage.

Piston Presser Design

Figure 10:
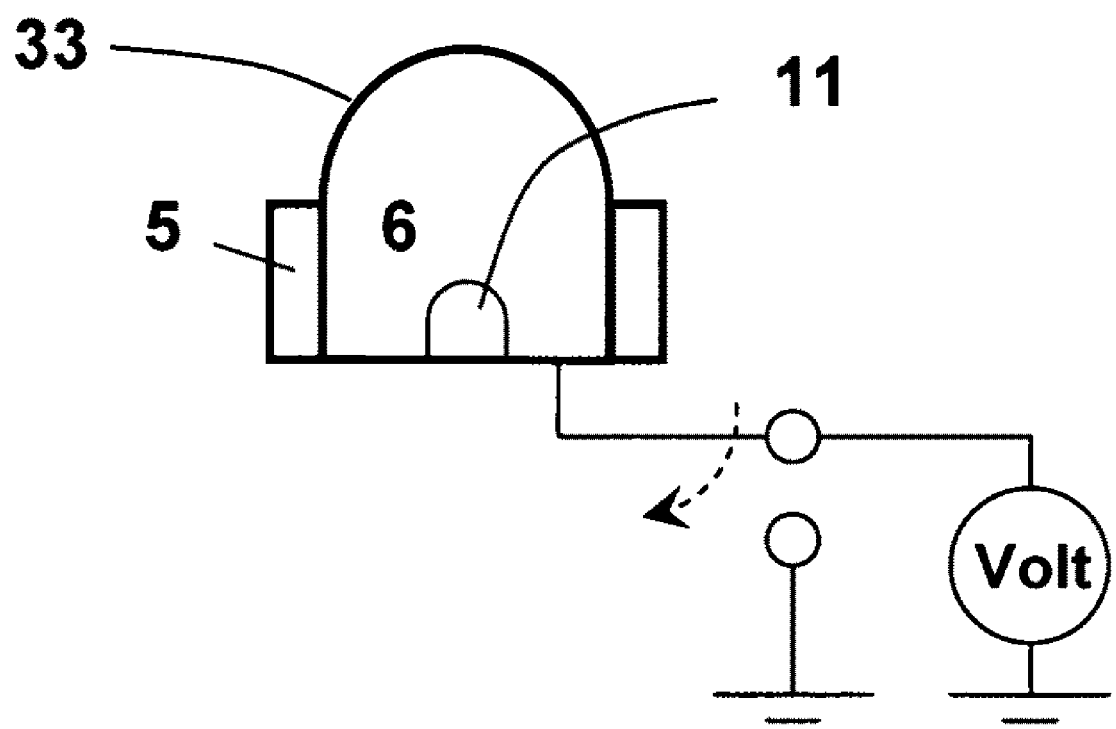
FIG. 10 is a simplified diagram illustrating an apparatus for forming a uniform coating on a surface according to an embodiment of the invention.

FIG. 10 is a simplified diagram illustrating an apparatus for forming a uniform coating on a surface according to an embodiment of the invention. As illustrated in FIG. 10, a piston system 6 according to an embodiment of the present invention can include a LED light source for in-process monitoring on the amount of phosphor powder particles being attracted by electrostatic charges. Material of high transparency to wavelength of LED light source such as glass may be selected for piston material. Transparent conductive material such as Indium Tin Oxide (ITO) may be coated on the top of surface.

In another embodiment, another implementation of the piston system 6: metal-dielectric-metal sandwich layer can form the surface of the piston, which is also served as a large capacitor in order to create large amount of electrostatic charges with a relative small applied voltage. The surface of this metal-dielectric-metal sandwich can be coated with an insulating layer.

According to another embodiment of the present invention, a method of forming a uniform particle layer on a receptor includes generating electrostatic charges on a surface of either a presser or the receptor, attaching a layer of a particle material on the charged surface, applying a pressure between the presser and the receptor at an elevated temperature to form a substantially uniform particle layer on the receptor.

In an embodiment, the first surface and the second surface are substantially complementary in shape.

In some embodiments, the above method also includes forming a binder layer. In an embodiment, the binder layer is formed on the receptor. In another embodiment, the binder layer is formed on the presser. In yet another embodiment, the binder layer may be formed by softening a surface region of the receptor. In some embodiments, the particles are pressed into the binder layer.

In another embodiment of the above method, the formed particle layer has a substantially uniform thickness and high packing density.

In an embodiment, the particle material includes a luminescent power.

In some embodiments, the receptor includes a lens. In a specific embodiment, the receptor includes a lens configured for use in an LED-based device.

In yet another embodiment, the above method can be repeated to form multiple layers of luminescent powder containing layers, wherein each layer has a substantially uniform thickness and high packing density. In an embodiment each layer may contain one or more types of luminescent powders, and the luminescent powders in each layer may have the same or different luminescent properties.

According to an alternative embodiment of the present invention, a method of forming a particle layer on a first surface includes generating electrostatic charges on the first surface or a second surface, attaching a layer of a particle material on the charged surface, and applying a pressure between the first surface and the second surface at a predetermined temperature.

In an embodiment of the above method, a substantially uniform particle layer is formed on first layer.

In another embodiment, the predetermined temperature is an elevated temperature that is higher than room temperature.

In another embodiment, the present invention provides an apparatus for forming a layer of powder material on a first surface. The apparatus includes a head region having a second surface having a shape substantially matching the first surface. In an embodiment, the apparatus also has a base region having a stopper configured for applying a pressure between the first surface and the second surface.

In an embodiment, the head region is made of a material selected from a steel material, a metal-containing material, dielectric material, Teflon, etc. or combination thereof.

According to yet another embodiment, the present invention provides a method for forming a plurality of LED-based light devices. The method includes selecting a group of LED dice within a first wavelength range, forming a group of lenses each having a substantially uniform coating of a luminescent material suitable for an LED die in the first wavelength range, forming LED-based light devices including the group of LED dice and the group of lenses. In an embodiment, the lens is formed using one or more of the methods described herein.

According to another embodiment, the present invention provides a method for forming a plurality of LED-based lighting devices. The method includes dividing a plurality of LED dice into two or more groups of LED dice according to at least the wavelength of emitted light, dividing a plurality of lenses according to their optical properties, each lens having a substantially uniform coating of a luminescent material, and forming a plurality of LED-based lighting devices by matching one of the groups of LED dice and one of the groups of lenses, such that each of the LED-based lighting device has a desired optical characteristics. In an embodiment, the lenses are formed using one or more of the methods described herein.

According to another embodiment, the present invention provides a lens. The lens has a substantially uniform coating of a luminescent material. In some embodiments, the lens is formed using one or more of the methods describe herein. In an embodiment, the lens includes a binder layer with embedded luminescent material. In an embodiment, the lens is made of a transparent material having a surface region with embedded luminescent material.

Figure 11A:
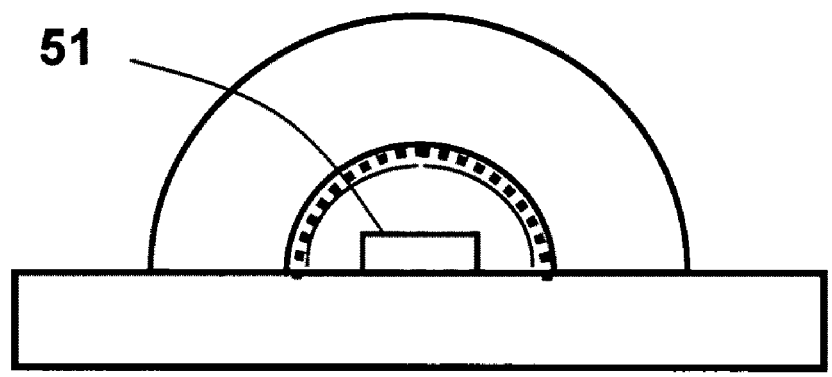
FIGS. 11A, 11B, 12A, and 12B are simplified cross sectional views of exemplary LED packages comprising LED devices and the lens containing luminescent materials according to embodiments of the invention.
Figure 11B:
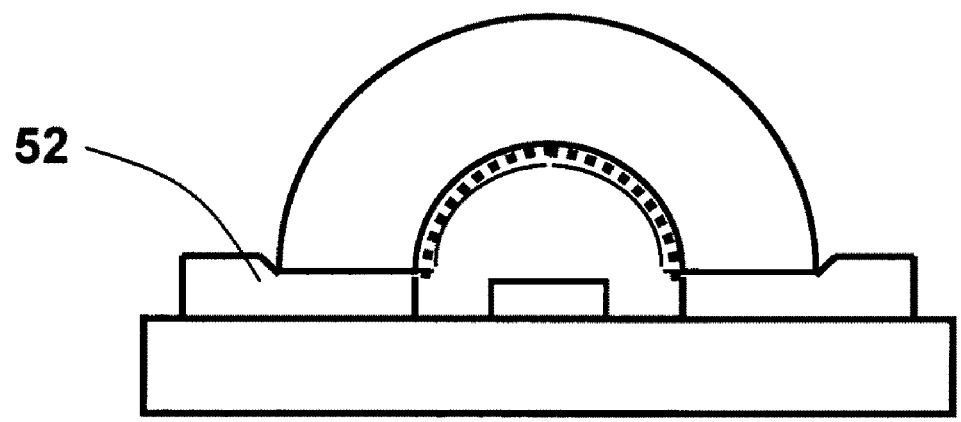

According to another embodiment, the present invention provides an LED-based lighting device. The lighting device includes an LED-die and a lens. The lens has a substantially uniform coating of a luminescent material. In an embodiment, the lens is formed using one or more of the methods describe herein. In an embodiment, the LED die is configured to emit light of a first wavelength, the lens has a substantially uniform coating containing a phosphor material, and the LED-based lighting device is configured to emit light of a target wavelength. The lens may be directly attached to LED supporting carrier with an appropriate adhesive as shown in FIG. 11A or attached to a package housing 52 as shown in FIG. 11B, depending on the design of LED-based lighting device. The shape and dimension of the lens may be varied with desired optical performances and quantity of LED in the whole package as illustrated in FIG. 12A and FIG. 12B.

Figure 12A:
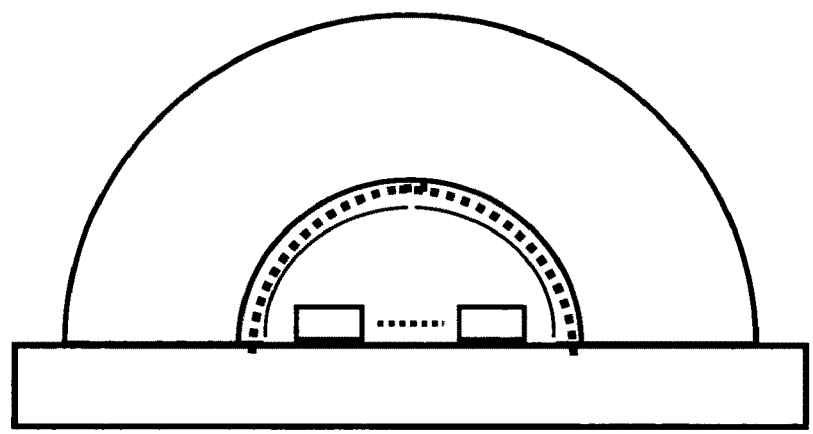
Figure 12B:
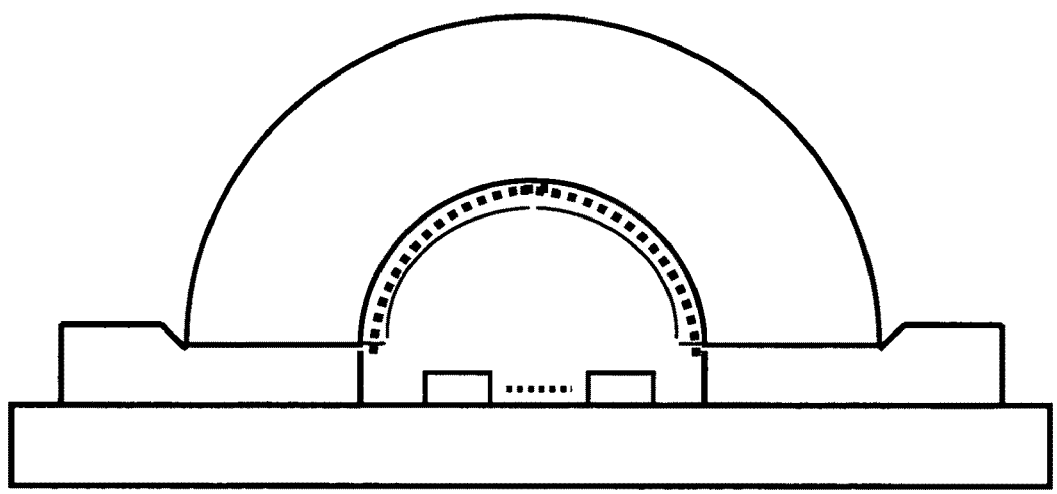

In another embodiment, the present invention provides an LED-based light device having multiple LED dices and a lens, such as those shown in FIGS. 12A and 12B.

Forming Particle-Containing Layers During Lens Fabrication

In a particular embodiment of the present invention, the phosphor powders, which may contains single or multiple different properties of phosphor powder particles, may be mixed with liquid binder materials, such as silicone, epoxy, thermoplastics, or any lens material. In this embodiment, phosphor particle powders are mixed with liquid binder materials such as silicone, or epoxy, and so on.

Figure 13:
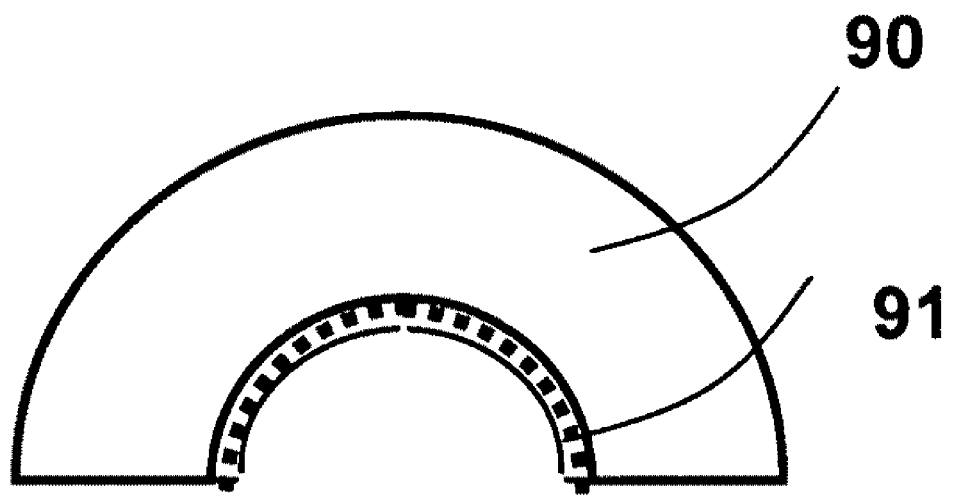
FIG. 13 is a simplified cross-sectional view illustrating a method for forming particle-containing layers during lens fabrication according to an embodiment of the present invention.

FIG. 13 is a simplified cross-sectional view illustrating a method for forming particle-containing layers during lens fabrication according to an embodiment of the present invention. As shown, lens 90 is formed with a molding process, such as injection molding or compression molding or transfer molding process or other molding techniques. Lens materials in this embodiment may include any material that is substantially transparent to the wavelengths of interest. For examples, the lens material includes silicone, epoxy, glass, thermosetting plastics (thermosets), thermoplastics or any type of LED encapsulating material. After the lens is formed, the phosphor and binder mixture 91 as shown in FIG. 13 can be applied on the surface of lens, e.g., using a molding process. The second mold for phosphor-binder mixture may have the same or different dimensions from the first mold of lens formation, depending on the requirements of phosphor-containing layer (e.g. thickness or shape) to achieve desired optical properties for LED package. The lens is then baked to fully cure material after the second mold. The process of coating phosphor-binder mixture may be repeated to create multiple phosphor-containing layers on the surface of lens.

Forming Phosphor Sheet Containing High Packing Density of Phosphor Particles

In a particular embodiment of the present invention, the highly packed particles of phosphor layer can be formed on the surface of the sheet or embedded inside of a sheet.

Figure 14A:
FIGS. 14A-14D are simplified cross-sectional views illustrating a method for forming phosphor particle sheet according to an embodiment of the present invention.
Figure 14B:
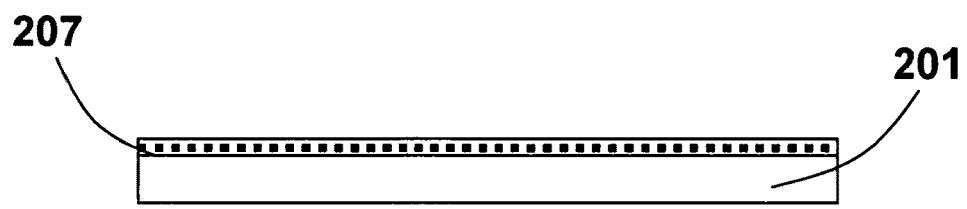
Figure 14C:
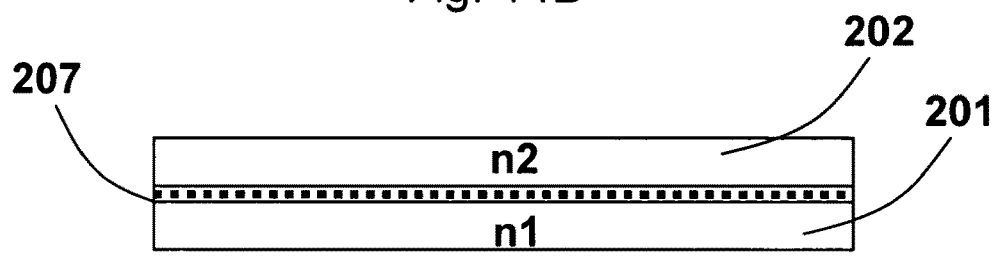
Figure 14D:
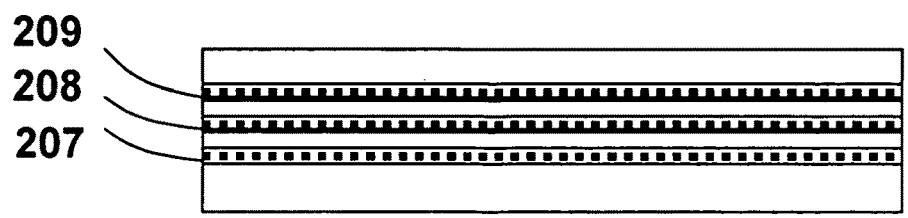

Unlike conventional phosphor sheet in which phosphor particles are uniformly distributed in the sheet, according to the present embodiment, phosphor particle layers with high packing density may be formed on the surface of the sheet or embedded inside of the sheet as illustrated in FIGS. 14B, 14C and 14D. For light conversion material such as phosphors, the high packing density of particle layers in the present embodiment can improve thermal dissipation, or reduce light scattering, and therefore enhance optical performance of final devices.

Sheet material 201 may be any transparent material used for LED encapsulation lens as described in embodiment such as silicone, glass, epoxy or thermoplastic. A layer of uniform particles is then formed on the top surface of material 201. As described in one of embodiments in the present invention, the uniform particle layer may be formed according to one of methods described above using electrostatic charged, wherein the presser surface may be flat or a roller as described in FIG. 9B, instead of semispherical shape. Thickness of particle layer may range from 5 to 200 μm depending on desired optical properties for LED package.

FIGS. 14A-14D are simplified cross-sectional views illustrating a method for forming phosphor layers with high packing density on the top of sheet or embedded inside the sheet material according to an embodiment of the present invention. Silicone or any transparent materials used for LED encapsulation can be first formed in a sheet form with an appropriate thickness depending on the desired optical performance as shown in FIG. 14A. Electrostatic charges are created on a surface of the silicone sheet or a presser surface. In some embodiments, electrostatic charges can be created on both the presser and the coating layer. A uniform distribution of phosphor powder particles are attracted by electrostatic charges and formed on the silicone sheet as illustrated in FIG. 14B. The silicone sheet can be formed with B-stage silicone or regular silicone with a coated binder layer to secure the phosphor particles. Binder particles such as silicone fine particles of appropriately mixed A and B parts or B-stage silicone fine particles may be mixed with phosphor particles to provide additional adhesive strength at subsequent lamination process step. Another sheet material 202 having the same or different refractive index is then laminated on the top of the sheet 201 containing a particle layer with a high packing density as shown in FIG. 14B, and then heated up a predetermined temperature. The sheet material 202 may be B-stage silicone or regular silicone coated with binder layer or glass or thermoplastic or any transparent lens material. A layer of phosphor powder particles with a high packing density is then embedded in the sheet, as shown in FIG. 14C. The process may be repeated to form multiple layers of phosphor particles of even different properties of phosphor materials, such as red, green, yellow or amber phosphor, as shown in FIG. 14D. The phosphor-containing sheet is then completed.

In some particular embodiments, each layer of phosphor particles such as layers of 207, 208, or 209 may comprise single or multiple types of phosphors, which are uniformly mixed at a certain ratio to provide desired color points and optical properties.

The refractive index of n1 and n2 as shown in FIG. 14C may be chosen to be the same or different. The refractive index of the cladding layer (i.e. non-phosphor containing region) may be the same or different. In some particular embodiment, the refractive index of material in non-phosphor containing region such as material 201, and 202 in FIG. 14C or in FIG. 14D may be selected to match the refractive index of phosphor material n (phosphor) ~1.8 to enhance light extraction of final devices.

The above-described phosphor-containing sheet for LED may be laminated on a whole LED-supporting carrier, comprising a plurality of LEDs. Alternatively, the silicone sheet may be singulated to the dimension that can cover individual LED chip or array, and then laminated onto the surface of single LED die or LED array. FIGS. 15A-15D are simplified diagrams illustrating examples of phosphor sheets according to embodiments of the present invention. As shown, the shape may be a square, rectangle, circle, square, or rectangle with corners as illustrated in FIG. 15D, or any appropriate shape suitable for desired LED performance, and sufficiently cover LED top surface and edge to ensure light passing through the phosphor conversion layer in all directions, as illustrated FIG. 15E in which a phosphor sheet 205 containing phosphor particles is placed over the LED, and covers the side of LED chips.

In some application, the phosphor sheet or plate 206 (e.g. FIG. 15A, 15B, 15C or 15D) may be placed on the top surface of LED or placed at a certain distance from the top of LED surface as shown in FIG. 15F.

Figure 16A:
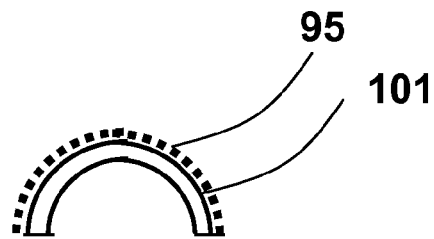
FIGS. 16A 16E are simplified cross-sectional views illustrating a method according to another embodiment of the present invention.
Figure 16B:
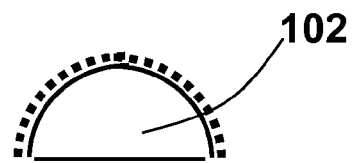
Figure 16C:
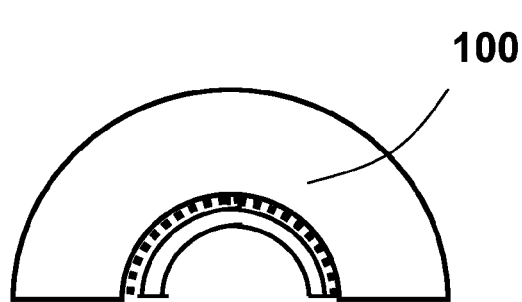
Figure 16D:
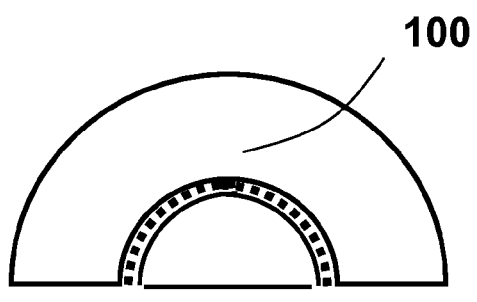
Figure 16E:
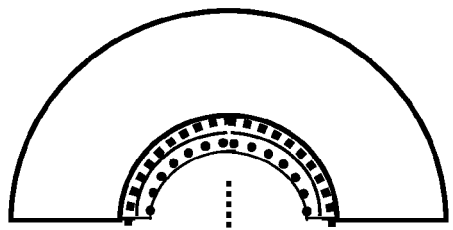

FIGS. 16A-16E are simplified cross-sectional views illustrating a method according to another embodiment of the present invention. Instead of forming phosphor powder particles on a sheet , the phosphor powder particles may be formed on surface of an inner lens 101 or 102, which is pre-formed with any transparent LED encapsulation material, as illustrated in FIGS. 16A and 16B. The phosphor powder particles on surface of an inner lens may be formed with electrostatic charges as described previously. A pre-formed silicone lens 100 is provided, and the inner lens with phosphor powder particles 95 is then compressed on inner surface of pre-formed lens 100, and heated up to a pre-determined temperature (>100 C) to fully cure binder material such as silicone or epoxy or glass , as illustrated in FIGS. 16C and 16D. Binder particles such as silicone fine particles of appropriately mixed A and B parts or B-stage silicone fine particles may be mixed with phosphor particles to provide additional adhesive strength at subsequent lamination process step. The process may be repeated to form multiple layers of phosphor particles with a high packing density on lens surface, as shown in FIG. 16E.

Method of Forming Uniform Phosphor Particles on Surface

Figure 17A:
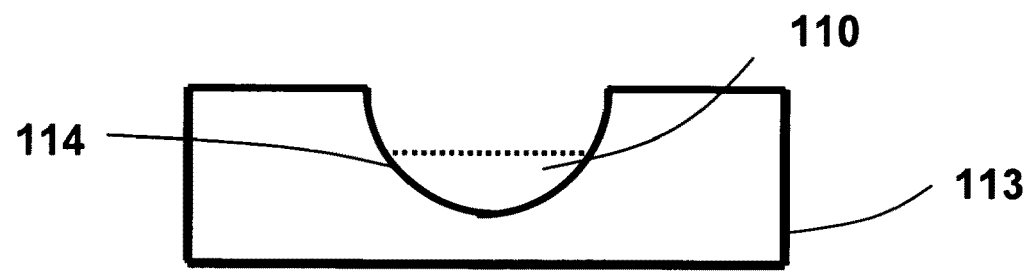
FIGS. 17A-17D are simplified cross-sectional views illustrating a method of forming uniform phosphor particles on a surface according to an embodiment of the present invention.
Figure 17B:
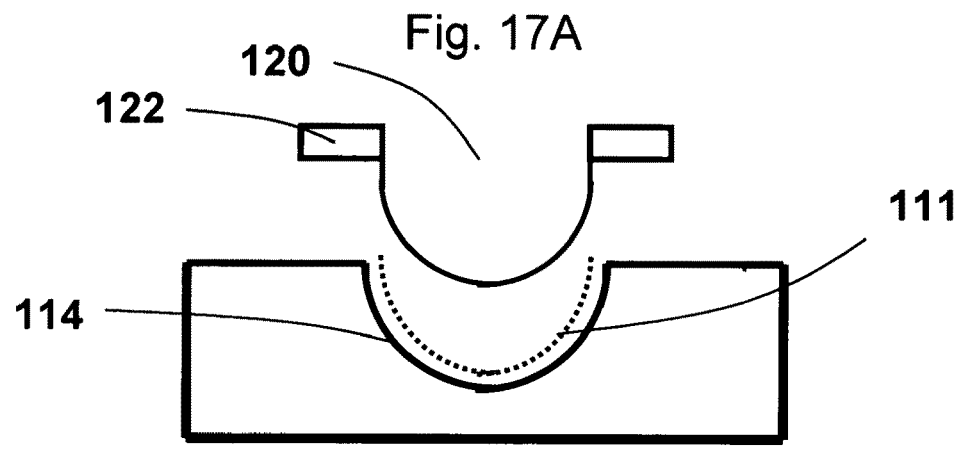
Figure 17C:
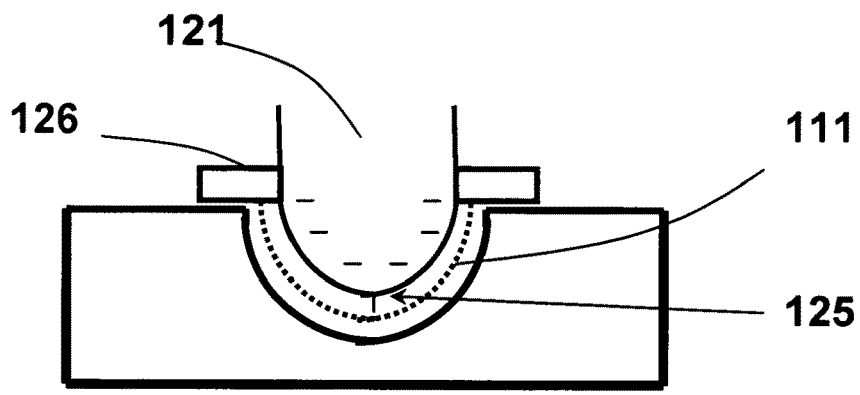
Figure 17D:
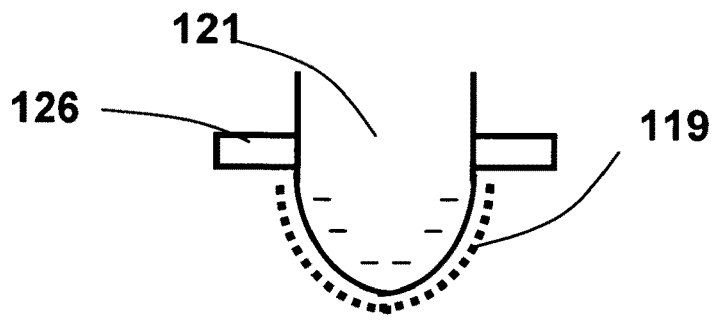

FIGS. 17A-17D are simplified cross-sectional views illustrating a method of forming uniform phosphor particles on surface according to an embodiment of the present invention. In one embodiment of the present invention, phosphor powder particles are attracted by electrostatic charges created on surface to form a uniform distribution of phosphor particle layer on charged surface is shown in FIG. 17D. The process of attracting phosphor particles is described as follows. The same methods can be used for other applications for any type of particles.

Phosphor powder particles are placed in a container 113. Phosphor powder particles inside container 113 may comprise single or multiple types of phosphors, which are uniformly mixed at a certain ratio in the container 113 for desired color points and optical properties.

The container may be made of electrical-conductive material or insulator,. In FIG. 17A, the container indentation surface 114 is in the shape corresponding to the desired shape of mold 120 or 121 as shown in FIGS. 17B and 17C, and filled with phosphor particles 110. The phosphor particles may be charged or non-charged with electrostatic charges A non-charged mold 120 with a shape corresponding to the surface of mold electrode 121, but of slightly larger dimension is used to shape phosphor particle surface 111 corresponding to the desired shape of container surface 114, as shown in FIG. 17B. A stopper 122 around mold 120 is used to control the traveling distance of the mold electrode into phosphor particles.

Phosphor particle surface is shaped by the mode 120, and the second mold electrode 121 uniformly charged with electrostatic charges is used to attract phosphor powder particles from indentation 111 created by non-charged mold 120. The second mold 121 is approaching to the indentation 111 to a certain distance 125 without making a contact with the phosphor particles, and then electrically attracting phosphor powders. A stopper 126 around the mold 121 is used to control the distance 125 between the mold surface and phosphor surface 111. A uniform layer of phosphor particles 119 is then formed on the surface of mold electrode 121, as shown in FIG. 17D. The amount of phosphor particles attracted onto the surface of electrode mold may be controlled by charge voltage, distance 125, time or any suitable process parameters.

Figure 18A:
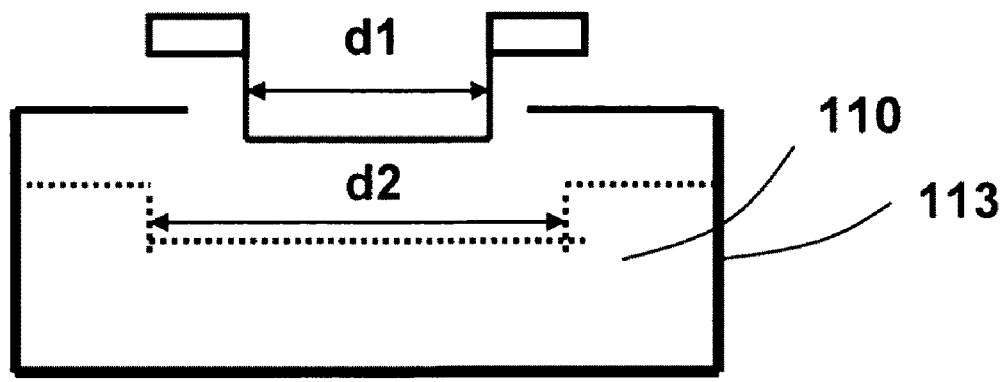
FIGS. 18A-18C are simplified cross-sectional views illustrating a method of forming uniform phosphor particles on various surfaces according to another embodiment of the present invention.
Figure 18B:
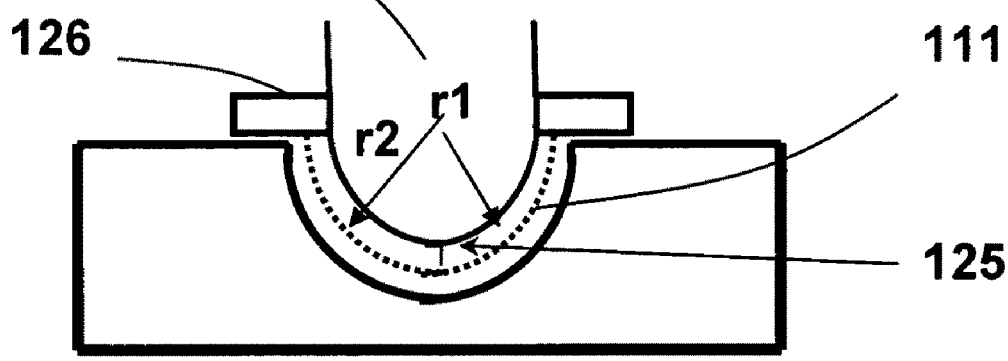
Figure 18C:
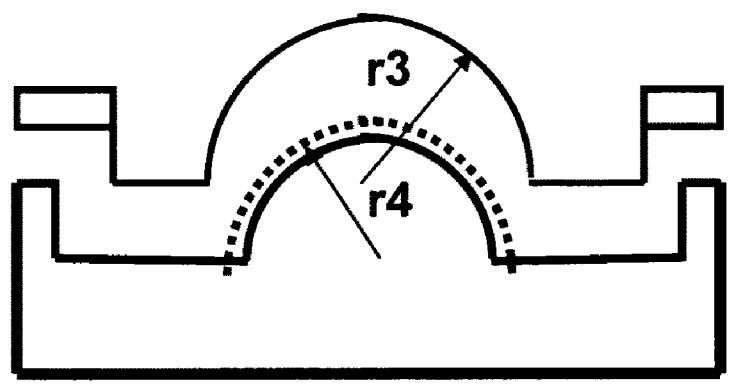

FIGS. 18A-18C are simplified cross-sectional views illustrating a method of forming uniform phosphor particles on various surface according to another embodiment of the present invention. Surface of phosphor particles in container 113 may be shaped to various shapes corresponding to the mold surface to produce desired phosphor geometry on lens surface for a special radiation pattern, such as convex, concave, flat surface as in FIG. 18A-18C or even irregular shapes.

Phosphor container may comprise various surface contours similar to the surface of electrode mold to hold phosphor particles in place, such as flat, concavity, convexity or irregular shapes as shown in FIG. 18A-18C. The surface of phosphor particles in container is shaped by a mode surface similar and corresponding to the shape of phosphor particle layer to be formed on the lens surface. The similarity in surface of electrode mode and container surface contour is of importance to attract phosphor particles uniformly over the electrode mold, such as mold 121. Once an electrical field is established, the shaped phosphor particles located on container surface are experiencing an electric field in all directions to the mold electrode, and then gradually attracted onto the mold electrode, forming an uniform particle layer on electrode surface.

After shaping phosphor powder surface by a mold, the $2^{nd}$ charged mold as described in the above embodiment is approaching to the phosphor surface without contacting phosphor particles to electrically attract particles to form an uniform particle distribution on mold surface. In order to maintain an equal electrical field to attract phosphor particle uniformly distributed on the surface of electrode (i.e. the $2^{nd}$ charge mode), for a flat shape as shown in FIG. 18A, d2, the dimension of indent surface, should be greater than d1, the dimension of electrode surface (d2>d1). To eliminate edge effects of electrical field generating close to the corner of the electrode, only partial surface area close to the center regain of electrode may be used to attract phosphor particles to ensure an uniform distribution of particle attraction.

For an electrode shape in FIG. 18B, the radius r1 of the electrode should be slightly less than the radius r2 of phosphor surface (r1<r2) to maintain an equal electrical field to uniformly attract phosphor particles on the surface of electrode (i.e. the $2^{nd}$ charge mode).

For an electrode shape in FIG. 18C, the radius r3 of the electrode should be greater than the radius r4 of phosphor surface (r3>r4) to maintain an equal electrical field to attract phosphor particle uniformly distributed on the surface of electrode (i.e. the $2^{nd}$ charge mode).

For an irregular shape, the dimension of electrode should be greater than the surface of indentation, and keep a constant distance across the entire electrode surface from the indent surface.

The surface of electrode as described may be flat, convex, concave or irregular shape, similar and corresponding to the desired shape of phosphor layer on LED encapsulation, and may be designed in a way to eliminate edge effect of electrical field to ensure that an uniform distribution of particles can be formed on a desired shape on electrode surface.

In order to prevent the sticking of lens material to the electrode, the mold carrying the phosphor particles, i.e. the charged $2^{nd}$ mold, a very thin film of a well-known non-stick mold material, having the general shape of the mold is placed over the mold. Alternatively, this may be accomplished by selecting non-stick mold material, using non-stick mold coating such as Teflon to minimize the sticking of lens material to the mold.

Method of Forming Uniform Phosphor Particles on Surface

As described above in some of the embodiments, the phosphor particles are placed in the container 115. Phosphor powder particles inside the container 115 may comprise single or multiple types of phosphors, which are uniformly mixed with a certain ratio in the container to provide desired color points and optical properties.

Figure 19:
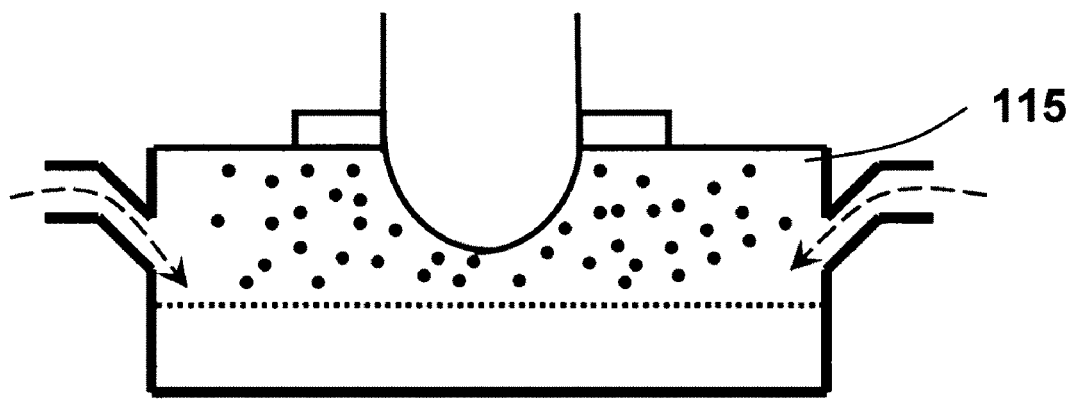
FIG. 19 is a simplified cross-sectional view illustrating a method of forming uniform phosphor particles on a surface according to another embodiment of the present invention.

The electrode, the charged mold, is placed through an opening on the top container to attract the phosphor particles as shown in FIG. 19. The electrode is electrically isolated from the container. Inert gas, such as Nitrogen, flows through air inlets on the container wall to create a uniform distribution of phosphor particles around the electrode inside the container. Phosphor particle adheres to the surface of the charged mold once the particle hits the surface of the mold. The amount of phosphor particles accumulated on the charged surface of the mold may be controlled by charge voltage on the mold, the exposure time of the mold to the inside of the particle container, or flow rate of inert gas or any process parameters suitable for control the thickness of phosphor particles.

The inert gas is then shut off until a desired thickness of phosphor particles is reached. The charged mold is removed from the container opening. An uniform distribution of particle layer is then formed on the electrode, the charged surface of the mold.

The phosphor particles may be also charged with an opposite polarity of charges on the electrodes. Alternatively, the electrode may be non-charged, but the phosphor particles are charged with electrostatic charges.

The surface of electrode as described may be flat, convex, concave or irregular shape, corresponding to the desired shape of phosphor layer on LED encapsulation, and may be designed in a way to eliminate edge effect of electrical field to to ensure that an uniform distribution of particles can be formed on a desired shape on electrode surface.

Mold or the electrode surface may be specially treated or using a very thin non-stick film placed over the mold to prevent lens material such as silicone from sticking to the mold surface.

Figure 20A:
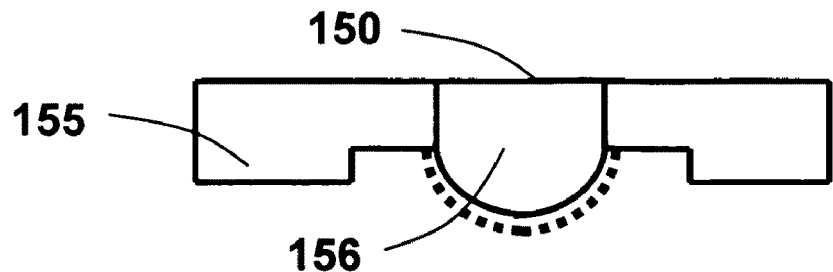
FIGS. 20A-20D are simplified cross-sectional views illustrating a method of attaching phosphor particles to a surface of non-cured lens material according to an embodiment of the present invention.

Attach Phosphor Particles to Surface of Non-Cured Lens Material During Lens Fabrication FIGS. 20A-20D are simplified cross-sectional views illustrating a method of attaching phosphor particles to surface of non-cured lens material according to an embodiment of the present invention. In FIG. 20A, a top mold 150 has shape corresponding to the desired shape of phosphor particle layer to be formed on inner surface of lens. The top mold presser 150 attracts phosphor powder by the previously described methods. The portion 156 of the mold can be charged with electrostatic charges to attract particles. The outer portion 155 of the top mold is non-charged, so that the particles will only adhere to the surface of the presser.

Figure 20B:
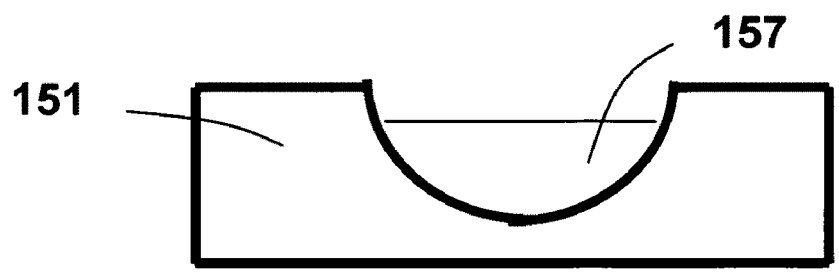
Figure 20C:
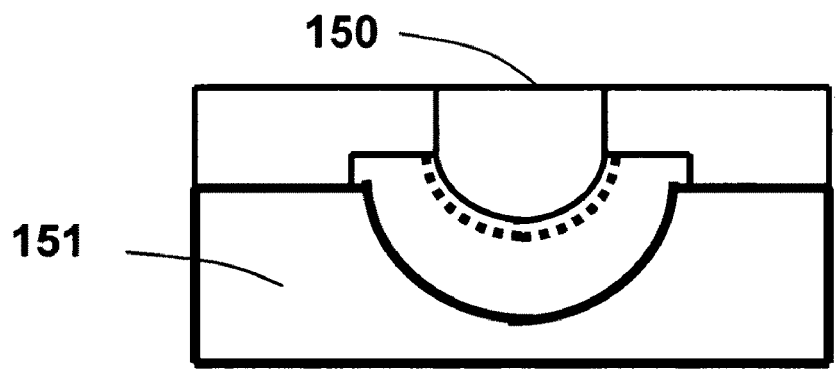
Figure 20D:
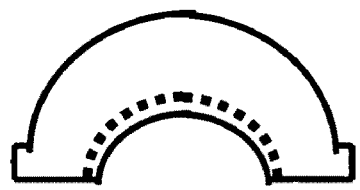

In FIG. 20B, a mold, 151, has indentions corresponding to the desired shape of a lens, and is then filled with a heat-curable materials 157 such as silicone, epoxy or even thermoplastic or glass that can be melted and re-formed at a raised temperature. The mold may be is formed of metal or non-conductive material. The two pieces of mold, 150, and 151 are pressed against each other so that the phosphor powder particles are implemented into the surface of lens. During the compression process, the phosphor powder particles are still held on the surface of the top mold presser with electrostatic charges, so the distribution of phosphor particles is not disturbed during compression process. The molds 150 and 151 are then heated up to cure the material, forming a lens and securing particles layers. After that, the top mold is discharge to release the particles.

Mold surface may be specially treated or using a very thin non-stick film placed over the mold to prevent lens material such as silicone from sticking to the mold surface.

The molding process may be repeated with different top molds to create multiple layers containing densely packed phosphor particles. Each layer may have a different property such as phosphor containing material or providing a special different radiation. As described previously in one of embodiments, each layer of phosphor particles may comprise single or multiple types of phosphors, which are uniformly mixed at a certain ratio to provide desired color points and optical properties.

In some of embodiments in the present invention, glue materials may be used in methods of attaching the attracted phosphor particles on the electrode surface to LED encapsulation materials such as silicone, glass, epoxy or thermoplastics or any materials transparent to the wavelengths of interest. The glue materials may include any of the following materials or combinations thereof, such as:

Liquid glue such as curable silicone or epoxy or hybrid,

Solid film such as B-stage silicone or epoxy or glass, or thermoplastics,

Encapsulation materials itself such as B-stage polymer, glass, thermoplastics, in which the attach interface of encapsulation can be locally melted or softened at a raised temperature to secure the particles, or Fine particles, which are pre-mixed with phosphor particles, and can be melted or softened at a raised temperature during particle attachment to secure particles on the surface of encapsulation.

In another embodiment, the glue material is transparent to the wavelengths of interest, and may be selected with an appropriate refractive index to optimize optical performance of final devices.

Figure 21A:
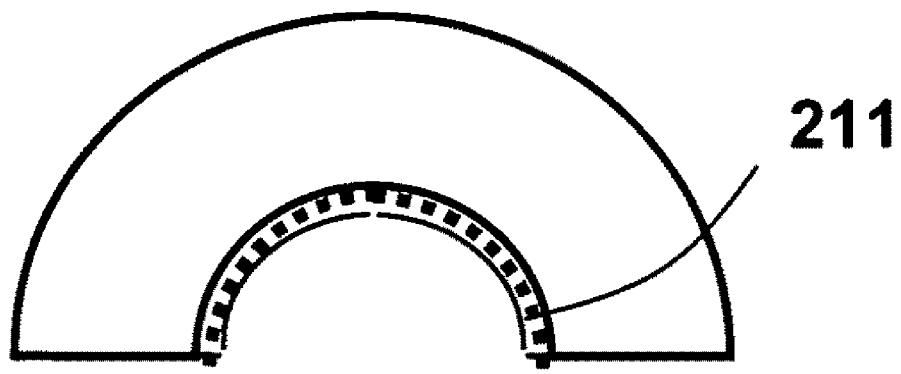
FIG. 21A-21B are simplified cross-sectional views illustrating a lens with particle-containing layers according to an embodiment of the present invention.
Figure 21B:
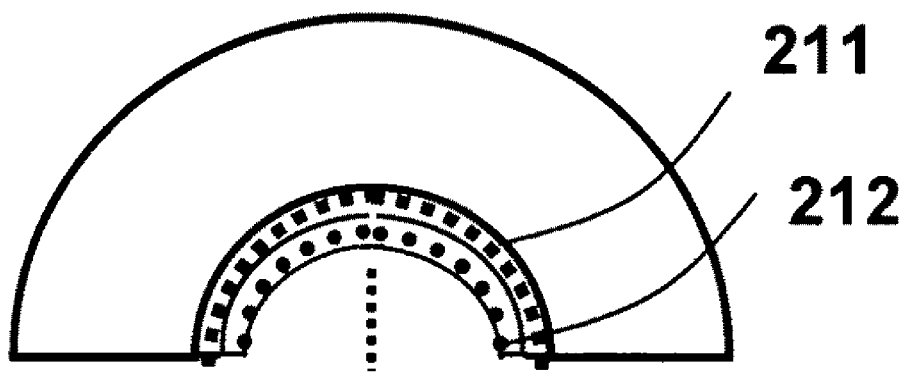

According to some of embodiments in the present invention, the phosphor particle layers formed on the surface of LED encapsulation such as a lens is illustrated in FIG. 21A or 21B. The lens may contain multiple phosphor layers, and each layer 211 or 212 of phosphor particles may comprise single or multiple types of phosphors, which are uniformly mixed at a certain ratio to provide desired color points and optical properties Use Mircoplasmas to Improve Adhesion at Interface of Lens and Particle Layers In one embodiment, pre-cleaning lens surface may be necessary to improve adhesion of phosphor particles to lens surface. Microplasmas, which is generated at atmospheric pressure, and confined to mini-meter range or less, may be used to locally clean lens surface prior to attachment of phosphor particles to improve particle adhesion to the surface of lens.

According to another embodiment of the present invention, a method of forming a lens includes applying a mixture of phosphor and a binder material to a preformed lens.

According to another embodiment of the present invention, a method for forming a phosphor-containing silicone sheet includes forming a phosphor particle layer on a separate supporting carrier.

According to another embodiment of the present invention, a wavelength converting material includes a first layer of silicone material with a first refractive index and no phosphor, and a second layer of silicone material on and in contact with the first layer of layer of silicone material. The second layer of silicone material is embedded with phosphor particles. In some embodiments, the phosphor particles are at least partially within the second layer of silicone material. In some other embodiments, the wavelength converting material includes a third layer of silicone material with a second index of refraction on and in contact with the second layer of silicone material. In certain embodiments, the second index of refraction is substantially the same as the first index of refraction.

In another embodiment, the wavelength converting material includes a multilayer structure, wherein the clear silicone may have identical or different index of refraction.

According to another embodiment of the present invention, a method of forming layered structure of wavelength converting material includes using B-stage silicone for embedding phosphor particles. In some other embodiments, the B-stage silicone is used for bonding.

According to another embodiment of the present invention, a method of forming uniform layer of phosphor particles on a surface includes the following steps:

Providing a container of phosphor particles. The phosphor particles may or may not charged with electrostatic charges Providing an electrode with a surface having a predetermined shape;

Forming a top surface in the particles, that is similar to the shape of the electrode;

Maintaining an equal distance between the electrode surface and the top surface of the particles, and the container surface where holds the shaped particles in place;

Applying an electric field between the electrode surface and the top surface of the container; and Forming a layer of particles on the electrode surface.

According to another embodiment, a method for forming a layer of particles includes the following steps:

Exposing an electrode having a predetermined shape in a vicinity of a plurality of particles, such that a substantially same distance is maintained between a surface of the electrode and a top surface of the particles; and applying an electric field between the electrode surface and the top surface of the particles or the surface of the container According to another embodiment of the present invention, a method for forming a layer of particles on an surface of an electrode includes providing an electrode above a container of particles, applying an air pressure to the particles to create a cloud of airborne particles, and causing at least some of the airborne particles to attach to a surface of the electrode to form a layer of particles.

Although the present invention has been described in terms of the presently preferred embodiment, it is to be understood that such disclosure is not to be interpreted as limiting. Various alternations and modifications will no doubt become apparent to those skilled in the art after reading the above disclosure.

Accordingly, it is intended that the disclosure be interpreted as covering all alternations and modifications as fall within the true spirit and scope of the invention.

What is claimed is:

1. A method of forming a sheet of wavelength converting material comprising:

depositing an amount of powder comprising a mixture of a binder in powder form and a first wavelength converting material in powder form onto a first sheet of material;

disposing a second sheet of material atop the amount of powder on the first sheet of material; and embedding the powder into at least the first sheet of material or the second sheet of material including pressing together the first sheet of material and the second sheet of material, thereby forming the sheet of wavelength converting material.

2. The method of claim 1 wherein the step of depositing comprises:

forming electrostatic charges on the first sheet of material; and attracting the amount of powder comprising the first wavelength converting material to the first sheet of material.

3. The method of claim 1 further comprising applying a layer of binder material on the second sheet of material prior to the step of disposing the second sheet of material atop the amount of powder on the first sheet of material, wherein the layer of binder material is in contact with the powder subsequent to the step of disposing.

4. The method of claim 1 wherein the powder further comprises particles of binder material, wherein the step of embedding further includes applying heat to the first and second sheets of material.

5. The method of claim 1 further comprising depositing an amount of powder comprising a second wavelength converting material onto the second sheet of material prior to the step of disposing the second sheet of material atop the amount of powder on the first sheet of material.

6. The method of claim 5 wherein the first wavelength converting material and the second wavelength converting material have different optical properties.

7. The method of claim 1 further comprising depositing an amount of powder comprising at least a second wavelength converting material and a third wavelength converting material onto the second sheet of material prior to the step of disposing the second sheet of material atop the amount of powder on the first sheet of material.

8. The method of claim 7 wherein optical properties of the second and third wavelength converting materials are different from optical properties of the first wavelength converting material.

9. The method of claim 1 wherein the step of depositing comprises:
disposing the first sheet of material in proximity to a reservoir of powder comprising the first wavelength converting material; and
creating an electric field between the first sheet of material and the reservoir of powder, wherein powder from the reservoir of powder is deposited onto the first sheet of material.

10. The method of claim 1 wherein the step of depositing comprises:
exposing the first sheet of material to an airborne distribution of powder comprising the first wavelength converting material; and
creating an electric field through the first sheet of material, wherein powder from the airborne distribution of powder is deposited onto the first sheet of material.

11. The method of claim 1 further comprising disposing the sheet of wavelength converting material atop one or more LEDs.

12. The method of claim 1 further comprising shaping the sheet of wavelength converting material.

13. The method of claim 1 further comprising disposing the sheet of wavelength converting material to cover a top surface and side surfaces of an LED.

14. The method of claim 1 further comprising disposing the sheet of wavelength converting material proximate to and spaced apart from a major surface of an LED.

15. A method for forming a sheet of wavelength converting material, comprising:
depositing an amount of powder comprising a mixture of a binder in powder form and a first wavelength converting material in powder form onto a sheet of material; and
pressing the powder with a presser to affix the powder onto the first sheet of material to form the sheet of wavelength converting material.

16. The method of claim 15 wherein the presser has a flat surface that is at least coextensive with a first surface of the sheet of material to affix the powder onto the sheet of material.

17. The method of claim 15 wherein the presser is a roller and wherein the step of pressing includes rolling the roller across a first surface of the sheet of material to affix the powder onto the sheet of material.

18. The method of claim 15 further comprising depositing a sheet of binder material atop the first sheet of material affixed with the amount of first wavelength converting material.

19. The method of claim 18 further comprising:
depositing an amount of a second wavelength converting material in powder form atop the sheet of binder material; and
affixing the amount of second wavelength converting material onto the sheet of binder material.

20. The method of claim 1 wherein the binder in powder form is a silicone powder.

21. The method of claim 1 wherein the binder in powder form is a B-stage silicone powder.

22. The method of claim 1 wherein the binder in powder form is a silicone powder.

23. The method of claim 1 wherein the binder in powder form is a B-stage silicone powder.

* * * * *